(12) United States Patent
Lee et al.

(10) Patent No.: US 8,643,040 B2
(45) Date of Patent: Feb. 4, 2014

(54) LIGHT EMITTING DEVICE AND LIGHT EMITTING DEVICE PACKAGE THEREOF

(75) Inventors: Sang Youl Lee, Seoul (KR); Ji Hyung Moon, Seoul (KR); June O Song, Seoul (KR); Kwang Ki Choi, Seoul (KR); Chung Song Kim, Seoul (KR); Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/102,478

(22) Filed: May 6, 2011

(65) Prior Publication Data

US 2011/0210362 A1     Sep. 1, 2011

(30) Foreign Application Priority Data

Oct. 12, 2010 (KR) .................. 10-2010-0099215
Dec. 22, 2010 (KR) .................. 10-2010-0132553

(51) Int. Cl.
*H01L 33/00* (2010.01)
(52) U.S. Cl.
USPC .............................. 257/98; 257/99
(58) Field of Classification Search
USPC ............................................ 257/98
See application file for complete search history.

(56) References Cited

U.S. PATENT DOCUMENTS

| | | | |
|---|---|---|---|
| 2009/0065900 A1 | 3/2009 | Saito et al. | 257/615 |
| 2009/0095973 A1 | 4/2009 | Tanaka et al. | 257/99 |
| 2010/0096652 A1* | 4/2010 | Choi et al. | 257/98 |
| 2010/0163894 A1* | 7/2010 | Uemura et al. | 257/95 |

FOREIGN PATENT DOCUMENTS

| | | |
|---|---|---|
| DE | 10 2007 019775 A1 | 10/2008 |
| DE | 10 2008 030584 A1 | 12/2009 |
| DE | 10 2008 034708 A1 | 2/2010 |
| JP | 60-175468 A | 9/1985 |
| KR | 10-01891761 B1 | 4/2009 |
| KR | 10-2010-0044726 A | 4/2010 |
| KR | 10-2010-0054756 A | 5/2010 |
| KR | 10-2010-0055283 A | 5/2010 |
| KR | 10-0986560 B1 | 10/2010 |
| WO | WO 2009/106063 A1 | 9/2009 |

OTHER PUBLICATIONS

European Search Report dated May 8, 2012 issued in Application No. 11 16 3693.

* cited by examiner

*Primary Examiner* — Telly Green
*Assistant Examiner* — Damian A Hillman
(74) *Attorney, Agent, or Firm* — Ked & Associates LLP

(57) ABSTRACT

A light emitting device includes a light emitting structure including a second conduction type semiconductor layer, an active layer, and a first conduction type semiconductor layer, a second electrode layer arranged under the light emitting structure, a first electrode layer having at least portion extending to contact the first conduction type semiconductor layer passing the second conduction type semiconductor layer and the active layer, and an insulating layer arranged between the second electrode layer and the first electrode layer, between the second conduction type semiconductor layer and the first electrode layer, and between the active layer and the first electrode layer, wherein said at least one portion of the first electrode layer contacting the first conduction type semiconductor layer has a roughness.

20 Claims, 20 Drawing Sheets

LIGHT EMITTING DEVICE AND LIGHT EMITTING DEVICE PACKAGE THEREOF

CROSS-REFERENCE TO RELATED APPLICATION

Pursuant to 35 U.S.C. §119(a), this application claims the benefit of the Patent Korean Application No. 10-2010-0099215, filed on Oct. 12, 2010, and No. 10-2010-0132553, filed on Dec. 22, 2010, which is hereby incorporated by reference as if fully set forth herein.

BACKGROUND OF THE DISCLOSURE

1. Field of the Disclosure

The present invention relates to a light emitting device, a light emitting device package thereof, a lighting device and a display device.

2. Discussion of the Related Art

A light emitting diode LED is a kind of semiconductor device for converting electricity into an infrared ray or a light by utilizing a characteristic of a compound semiconductor to transmit/receive a signal, or using as a light source.

Owing to physical and chemical characteristics, group III-V nitride semiconductors are spot lighted as essential materials of a light emitting device, such as the light emitting diode LED or a laser diode LD.

Since the light emitting diode is very environment friendly having no substances which harm an environment, such as mercury Hg used in the present lighting devices, such as incandescent lamps and fluorescent lamps, and has a long lifetime and low power consumption, the light emitting diode is replacing the present light sources.

SUMMARY OF THE DISCLOSURE

An object of the present invention is to provide a light emitting device, and a light emitting device package thereof.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device includes a light emitting structure including a second conduction type semiconductor layer, an active layer, and a first conduction type semiconductor layer, a second electrode layer arranged under the light emitting structure, a first electrode layer having at least portion extending to contact the first conduction type semiconductor layer passing the second conduction type semiconductor layer and the active layer, and an insulating layer arranged between the second electrode layer and the first electrode layer, between the second conduction type semiconductor layer and the first electrode layer, and between the active layer and the first electrode layer, wherein said at least one portion of the first electrode layer contacting the first conduction type semiconductor layer has a roughness.

Since the contact electrode has the roughness at the top side, the contact electrode has an increased contact area with the first conduction type semiconductor layer. And, as the resistance of the first electrode layer decreases more and more when the contact area between the contact electrode and the first conduction type semiconductor layer increases, an operation voltage of the light emitting device can be improved. For an example, by dropping the operation voltage of the light emitting device, optical output efficiency of the light emitting device can be improved. Moreover, as adhesion between the first electrode layer and the first conduction type semiconductor layer increases the more as the contact area between the first electrode layer and the first conduction type semiconductor layer increases the more, so reliability of the light emitting device can be improved.

The light emitting device can further include a support substrate under the first electrode layer, wherein the first electrode layer can include at least one contact electrode in contact with the first conduction type semiconductor layer passing through the second electrode layer, the second conduction type semiconductor layer, and the active layer, and the at least one contact electrode has a top side with the roughness. The first electrode layer can include a lower electrode layer arranged between the support substrate and the second electrode layer, and the at least one contact electrode which is a branch from the lower electrode layer in contact with the first conduction type semiconductor layer.

The contact electrode may have a width of 5 μm~200 μm, a height from a top side of the active layer to a top side of the contact electrode may be 0.4 μm~10 μm, and the roughness may have a width of 0.02 μm~100 μm, and a height of 0.2 μm~10 μm.

The width of the contact electrode may be higher than 5 μm since it is the minimum size for the current to flow through the contact electrode efficiently. Meanwhile, the width of the contact electrode may be lower than 200 μm so that a plurality of contact electrodes may be formed in light of common chip size.

The height from a top side of the active layer to a top side of the contact electrode may be 0.4 μm~10 μm. The lower limit of the height may be set as 0.4 μm since it is a minimum value to protect electrical short with active layer. The upper limit of the height may be set as 10 μm in light of the height of the first conduction type semiconductor layer (GaN) which is usually in the range of 4~6 μm.

The roughness may have a width of 0.02 μm~100 μm. The width of the roughness may be higher than 0.02 μm since 0.02 μm is the minimum value that can be practically manufactured. The maximum value of the width of the roughness may be set as 100 μm so that a plurality of roughness can be formed.

The roughness may have a height of 0.2 μm~10 μm. The minimum value of the height of the roughness may be 0.2 μm since the roughness which has smaller height is difficult to manufacture. The upper limit of the height may be set as 10 μm in light of the height of the first conduction type semiconductor layer (GaN) which is usually in the range of 4~6 μm.

The insulating layer can be arranged between the lower electrode layer and the second electrode layer, between a side of the contact electrode and the second electrode layer, between the side of the contact electrode and the second conduction type semiconductor layer, and between the side of the contact electrode and the active layer.

The roughness can have a vertical cross-section presenting a stepwise structure or a tiered structure.

The first electrode layer can be arranged on the second electrode layer, and can include a contact portion in contact with the first conduction type semiconductor layer overlapped with the light emitting structure in a vertical direction, and an exposed portion not overlapped with the light emitting structure in the vertical direction and exposed from the light emitting structure, wherein the vertical direction can be a direction facing from the second electrode layer toward the first conduction type semiconductor layer, and a top side of the contact portion can have the roughness.

The first electrode layer can have at least one further portion overlapped by the light emitting structure having a top side with a roughness in contact with the first conduction type semiconductor layer.

The first electrode layer can include a contact portion in contact with the first conduction type semiconductor layer, and an exposed portion opened from the first conduction type semiconductor layer, wherein the contact portion can have a roughness.

The light emitting structure can be divided into a plurality of cell regions spaced from one another on the second electrode layer by predetermined distances, and the first electrode layer can include a contact portion in contact with the first conduction type semiconductor layer passed through the second conduction type semiconductor layer and the active layer of each of the plurality of cell regions, and an exposed portion exposed from the first conduction type semiconductor layer, wherein the contact portion can have the roughness.

The first electrode layer can include at least one of an ohmic layer, a reflective layer, and a bonding layer.

The at least one contact electrode can have a top side higher than a top side of the active layer, and lower than a top side of the first conduction type semiconductor layer.

The second electrode layer can have one side region opened from the light emitting structure, and can further include a second electrode pad arranged on the one opened side region.

The first electrode layer can have one side opened from the light emitting structure, and can further include a first electrode pad arranged on the one opened side of the first electrode layer.

The insulating layer surrounds the at least one contact electrode, wherein a portion of the insulating layer which surrounds the side of the at least one contact electrode can have a roughness in contact with the first conduction type semiconductor layer, and the roughness can have a random irregular shape. The light emitting device can further include a protective layer arranged at a sidewall of the light emitting structure.

In another aspect of the present invention, a light emitting device package includes a package body, a light emitting device in accordance with the present invention on the package body, a first electrode layer and a second electrode layer provided on the package body connected to the light emitting device, and a resin layer which surrounds the light emitting device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. In description of embodiments that a layer (a film), a region, a pattern, or a structure is formed "on" or "under" a substrate, a layer (a film), a region, a pad, or a pattern, the "on", or "under" implies that the layer (the film), the region, the pattern, or the structure is formed "on" or "under" the substrate, the layer (the film), the region, the pad, or the pattern directly or indirectly with other substrate, layer (film), region, pad, or pattern, disposed therebetween. And, in a case of expression of "on or under", the expression can mean, not only an upper side, but also an underside of an element.

A size shown in a drawing is exaggerated, omitted or shown schematically for convenience or clarity of description. And, a size of an element is not shown to scale, perfectly. Wherever possible, the same reference numbers will be used throughout the drawings to refer to the same or like parts. A light emitting device, a method for fabricating the same, and a light emitting device package thereof in accordance with a preferred embodiment of the present invention will be described with reference to the attached drawings.

Figure 1:
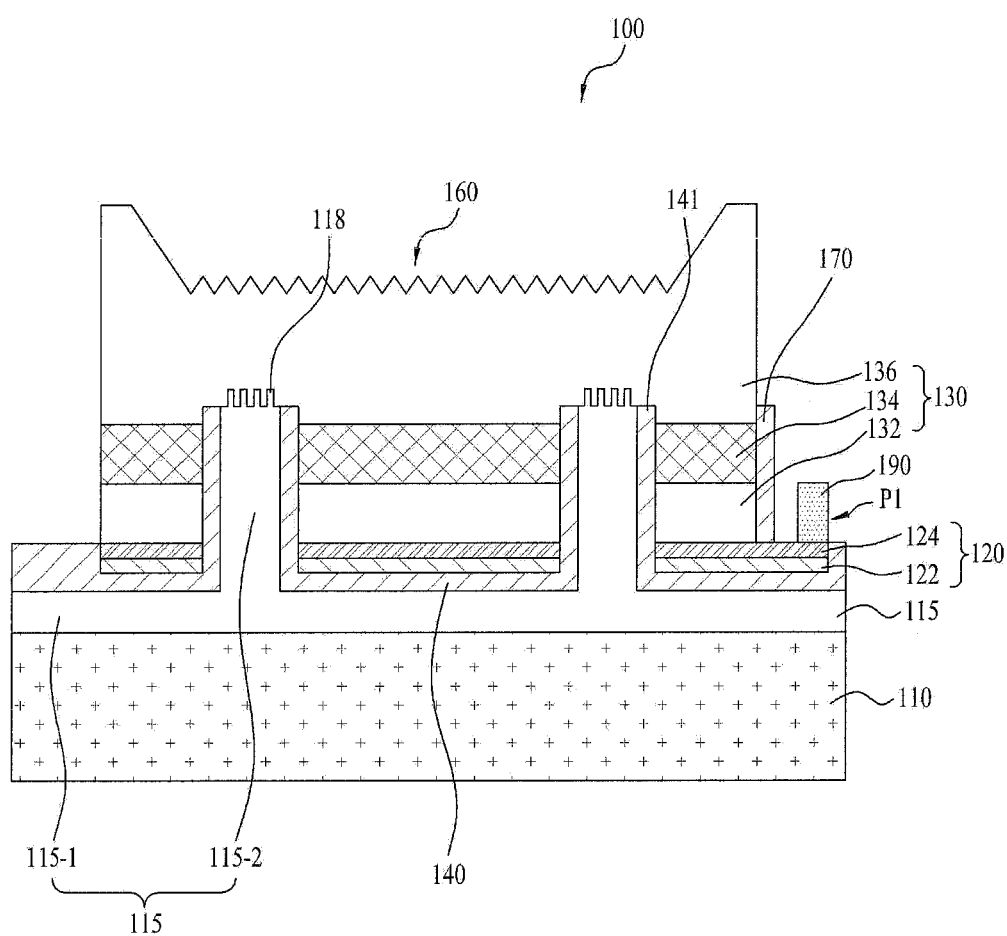
FIG. 1 illustrates a section of a light emitting device in accordance with a preferred embodiment of the present invention.

FIG. 1 illustrates a section of a light emitting device 100 in accordance with a preferred embodiment of the present invention. Referring to FIG. 1, the light emitting device 100 includes a light emitting structure 130 having a second conduction type semiconductor layer 132, an active layer 134, and a first conduction type semiconductor layer 136, a second electrode layer 120 arranged under the light emitting structure 130 in contact with the second conduction type semiconductor layer 132, a first electrode layer 115 in contact with the first conduction type semiconductor layer 136 passed through the second electrode layer 120, the second conduction type semiconductor layer 132 and the active layer 134, an insulating layer 140 arranged between the second electrode layer 120 and the first electrode layer 115, between the second conduction type semiconductor layer 132 and the first electrode layer 115, and between the active layer 134 and the first electrode layer 115, a protective layer 170 arranged at a side of the light emitting structure 130, and a second pad 190 arranged on the second electrode layer 120 exposed from the light emitting structure 130, wherein a portion of the first electrode layer 115 in contact with the first conduction type semiconductor layer 136 has an uneven portion 118, e.g. roughness. The light emitting device 100 can include a support substrate 110 on an underside of the first electrode layer 115.

The light emitting device 100 includes an LED having a plurality of compound semiconductor layers, for an example, compound semiconductor layers of group 3~5 elements, wherein the LED can be a color LED which emits a blue color, a green color, or a red color, or an UV LED. The light from the LED can be produced by using different semiconductor, and is not limited to above.

The support substrate 110 can be a conductive substrate or an insulating substrate, and supports the light emitting structure 130. For an example, the support substrate 110 can be a base substrate having a predetermined thickness of copper Cu, gold Au, nickel Ni, molybdenum Mo, or copper-tungsten Cu—W, and can include at least one of a carrier wafer, for an example, Si, Ge, GaAs, ZnO, and SiC, and a conductive sheet.

The first electrode layer 115 is arranged on the support substrate 110. The first electrode layer 115 can include at least one of an ohmic layer, a reflective layer, a bonding layer. The first electrode layer 115 can be in ohmic contact with the first conduction type semiconductor layer 136 or the support substrate 110 by using a reflective metal or a conductive oxide.

The first electrode layer 115 can include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO. However, materials of the first electrode layer 115 are not limited to above materials.

Or, the first electrode layer 115 can be formed of Ag, Ni, Al, Rh, Pd, Ir, Ru, Mg, Zn, Pt, Au, Hf and a selective combination of above materials. Or, the first electrode layer 115 can be single or multiple layers of a reflective electrode material. If the first electrode layer 115 has an ohmic characteristic, no additional ohmic layer can be required.

Moreover, the first electrode layer 115 can include an adhesive layer which improves adhesion to the support substrate 110. In this instance, the adhesive layer can include a barrier metal or a bonding metal. For an example, the adhesive layer can include at least one of Ti, Au, Sn, Ni, Cr, Ga, In, Bi, Cu, Ag or Ta.

The second electrode layer 120 is arranged on the first electrode layer 115, and the insulating layer 140 is arranged between the second electrode layer 120 and the first electrode layer 115 for insulating the first electrode layer 115 from the second electrode layer 120.

Though the second electrode layer 120 can be a stacked structure of ohmic layer/reflective layer/bonding layer, or a stacked structure of ohmic layer/reflective layer, or a stacked structure of reflective layer (ohmic layer)/bonding layer, the structure of the second electrode layer 120 is not limited to above. For an example, the second electrode layer 120 can have a structure in which the reflective layer 122 and the ohmic layer 124 are stacked on the insulating layer 140 in succession.

The reflective layer 122 is arranged between the ohmic layer 124 and the insulating layer 140, and can be formed of a material having reflectivity greater than 50%. For an example, the reflective layer 122 can be formed of Ag, Ni, Al, Rh, Pd, Ir, Ru, Mg, Zn, Pt, Au, Hf or an alloy of a selective combination of above materials, or multiple layers of above materials and a light transmissive conductive material of IZO, IZTO, IAZO, IGZO, IGTO, AZO, and ATO. For an example, the reflective layer 122 can have a stacked structure of IZO/Ni, AZO/Ag, IZO/Ag/Ni, or AZO/Ag/Ni. Or, if the reflective layer 122 is formed of a material which is in ohmic contact with the light emitting structure (For an example, second conduction type semiconductor layer 132), no additional ohmic layer 124 may be formed. However, the present invention is not limited to this.

The ohmic layer 124 is in ohmic contact with an underside of the light emitting structure 130 (For an example, the second conduction type semiconductor layer 132) and can be a layer or a plurality of patterns. For an example, the ohmic layer 124 can be single or multiple layers of at least one selected from ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni, Ag, Ni/$IrO_x$/Au, and Ni/$IrO_x$/Au/ITO. The ohmic layer 124 is formed for making smooth injection of a carrier into the second conduction type semiconductor layer 132, and therefore is not essential.

The light emitting structure 130 is arranged on the second electrode layer 120. The light emitting structure 130 can be in a mode in which the second conduction type semiconductor layer 132, the active layer 134, and the first conduction type semiconductor layer 136 are stacked in succession.

The second conduction type semiconductor layer 132 is arranged on the ohmic layer 124 to be in ohmic contact with the ohmic layer 124. The second conduction type semiconductor layer 132 can be a compound semiconductor of group 3~5 elements having a second conduction type dopant doped thereto.

The second conduction type semiconductor layer 132 can be formed of a semiconductor material having composition of $In_xAl_yGa_{1-x-y}N$ ($0\le x\le 1$, $0\le y\le 1$, $0\le x+y\le 1$), for an example, one selected from GaN, AlN, AlGaN, InGaN, InN, InAlGaN, AlInN, AlGaAs, GaP, GaAs, GaAsP, AlGaInP, and can have a p type dopant, such as Mg, Zn, Ca, Sr, Ba doped thereto. The second conduction type semiconductor layer 132 can have single or multiple layers, but the present invention does not limit this.

The active layer 134 is arranged on the second conduction type semiconductor layer 132 of a compound semiconductor of group 3~5 elements. The active layer 134 can be formed of a semiconductor material having composition of $In_xAl_yGa_{1-x-y}N$ ($0\le x\le 1$, $0\le y\le 1$, $0\le x+y\le 1$), and can include any one of single Quantum Well structure, a Multi Quantum Well structure, a Quantum dot structure or a Quantum wire structure.

The active layer 134 can be constructed of a well layer/a barrier layer of a compound semiconductor of group 3~5 elements, for an example, InGaN well layer/GaN barrier layer or InGaN well layer/AlGaN barrier layer. There can be a conductive clad layer of an AlGaN group semiconductor arranged between the active layer 134 and the first conduction type semiconductor layer 136 or between the active layer 134 and the second conduction type semiconductor layer 132.

The first conduction type semiconductor layer 136 is arranged on the active layer 134 and can be a compound semiconductor of group 3~5 elements having a first conduction type dopant doped thereto. The first conduction type semiconductor layer can be formed a semiconductor material having composition of $In_xAl_yGa_{1-x-y}N$ ($0\le x\le 1$, $0\le y\le 1$, $0\le x+y\le 1$), for example, a semiconductor material selected from GaN, AlN, AlGaN, InGaN, InN, InAlGaN, AlInN, AlGaAs, GaP, GaAs, GaAsP, AlGaInP, and can have an n type dopant, such as Si, Ge, Sn, Se, Te doped thereto. The first conduction type semiconductor layer 136 can be constructed of single or multiple layers. However, the present invention does not limit on this. The first conduction type semiconductor layer 136 can have a top side with a roughness 160 or a pattern formed thereon for optical extraction efficiency.

The first conduction type semiconductor layer 136 can be arranged on a top of a chip, the active layer 134 can be arranged on an underside of the first conduction type semiconductor layer 136, the second electrode layer 120 can be arranged on an underside of the second conduction type semiconductor layer 132, the insulating layer 140 can be arranged on an underside of the second electrode layer 120, the first electrode layer 115 can be arranged on an underside of the insulating layer 140, and the support substrate 110 can be arranged on an underside of the first electrode layer 115.

The first electrode layer 115 is in contact with the first conduction type semiconductor layer 136 passed through the second electrode layer 120, the second conduction type semiconductor layer 132, and the active layer 134 in a vertical direction, and an insulating layer 140 is arranged between a passed through portion of the second electrode layer 120 and the first electrode layer 115, between a passed through portion of the second conduction type semiconductor layer 132 and the first electrode layer 115, and between a passed through portion of the active layer 134 and the first electrode layer 115. A vertical direction mentioned hereafter is a direction facing from the first electrode layer 115 toward the first conduction type semiconductor layer 136.

For an example, the first electrode layer 115 has at least one contact electrode 115-2 which is a branch in the vertical direction in contact with the first conduction type semiconductor layer 136 passed through the second electrode layer 120, the second conduction type semiconductor layer 132, and the active layer 134.

The first electrode layer 115 can include a lower electrode layer 115-1 and at least one contact electrode 115-2. The lower electrode layer 115-1 is in contact with the support substrate 110 and is parallel thereto. The at least one contact electrode 115-2 is in electric contact with the first conduction type semiconductor layer 136 which is a branch from the lower electrode layer 115-1 in the vertical direction passed trough the second electrode layer 120, the second conduction type semiconductor layer 132, and the active layer 134. In this instance, the at least one contact electrode 115-2 has a top side positioned higher than the active layer 134 and lower than a top side of the first conduction type semiconductor layer 136. That is, a portion of the top side of the contact electrode 115-2 can be arranged in the first conduction type semiconductor layer 136.

The contact electrode 115-2 has a roughness 118 at the top side. In this instance, the roughness 118 can have a regular or an irregular pattern. For an example, the roughness 118 can be a random roughness at a portion in contact with the first conduction type semiconductor layer 136. The top side of the contact electrode 115-2 having the roughness 118 is in contact with the first conduction type semiconductor layer 136. In this instance, the top side of the contact electrode 115-2 having the roughness 118 can be in ohmic contact with the first conduction type semiconductor layer 136.

Since the contact electrode 115-2 has the roughness 118 at the top side, the contact electrode 115-2 has an increased contact area with the first conduction type semiconductor layer 136. And, as resistance of the first electrode layer 115 decreases the more as the contact area between the contact electrode 115-2 and the first conduction type semiconductor layer 136 increases the more, an operation voltage of the light emitting device 100 can be improved. For an example, by dropping the operation voltage of the light emitting device, optical output efficiency of the light emitting device can be improved. And, as adhesion between the first electrode layer 115 and the first conduction type semiconductor layer 136 increases the more as the contact area between the first electrode layer 115 and the first conduction type semiconductor layer 136 increases the more, reliability of the light emitting device 100 can be improved.

Figure 4:
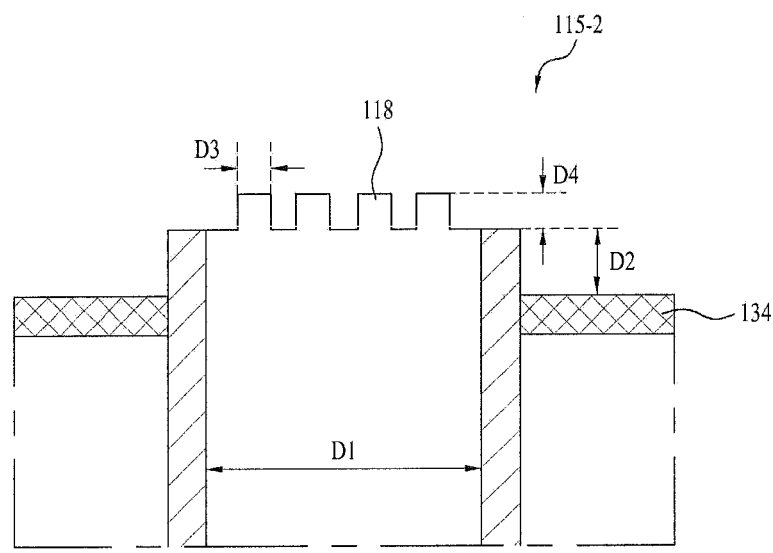
FIG. 4 illustrates an enlarged section of the contact electrode in FIG. 1.

FIG. 4 illustrates an enlarged section of the contact electrode in FIG. 1. Referring to FIG. 4, the contact electrode 115-2 can have a width D1 of 5 μm~200 μm, preferably 60 μm. A height D2 of a portion of the top side of the contact electrode 115-2 arranged in the first conduction type semiconductor layer 136, i.e., a height D2 from a top side of the active layer 134 to a top side of the contact electrode 115-2 can be 0.4 μm~10 μm, preferably, 0.8 μm.

A horizontal direction cross section of the roughness 118 formed at the top side of the contact electrode 115-2 can have various shapes. For an example, the section can be circular or polygonal including square. In this instance the horizontal direction can be a direction parallel to the support substrate 310.

A width D3 of the roughness 118 formed at the top of the contact electrode 115-2 can be 0.02 μm~100 μm, preferably 40 μm. For an example, the width D3 can be a diameter of a section if the section is circular, and a length of one side if polygonal. And, a height D4 of the roughness 118 formed at the top side of the contact electrode 115-2 can be 0.2 μm~10 μm, preferably 1 μm~2 μm.

The contact electrode 115-2 can be branches from the lower electrode layer 115-1 such that a plurality of the contact electrodes 115-2 are arranged spaced from one another. If the contact electrode 115-2 is plural, smooth current supply to the first conduction type semiconductor layer 136 can be made.

Though the contact electrode 115-2 can have at least one of patterns selected from a radial pattern, a cross pattern, a line pattern, a curve pattern, a loop pattern, a hook pattern, and a ring pattern, the pattern of the contact electrode 115-2 is not limited to this.

The insulating layer 140 insulates the first electrode layer 115 from other layers 120, 132, and 134. The insulating layer 140 is positioned between the first electrode layer 115 and the second electrode layer 120 for insulating the first electrode layer 115 from the second electrode layer 120, electrically. That is, the insulating layer 140 is arranged between the lower electrode layer 115-1 and the reflective layer 122 for electric insulation of the lower electrode layer 115-1 from the reflective layer 122.

And, a portion 141 of the insulating layer 140 is arranged in each of spaces between a side of the contact electrode 115-2 and the second electrode layer 120, between a side of the contact electrode 115-2 and the second conduction type semiconductor layer 132, and between a side of the contact electrode 115 and the active layer 134 for electric insulation of the contact electrode 115-2 from other layers 120, 132, and 134. And, the insulating layer 140 can be arranged between the side of the contact electrode 115-2 and the first conduction type semiconductor layer 136, too.

For an example, the portion 141 of the insulating layer 140 can be arranged to surround the sides of the contact electrode 115-2 except the top side of the contact electrode 115-2 for blocking electric shorts with other layers 120, 132, and 134.

One side region of the second electrode layer 120, for an example, one side region of the ohmic layer or/and the reflective layer 122, can be exposed from the light emitting structure 130, and the second electrode pad 190 is arranged on the one side region P1 of the second electrode layer 120. In this instance, the one region of the second electrode layer 120 can be the outermost peripheral region of the second electrode layer 120.

The second electrode pad 190 can have an electrode shape. And, the protective layer 170 can be arranged at a side of the light emitting structure 130 adjacent to the one side region P1 of the second electrode layer 120 exposed thus. For an example, the protective layer 170 can be arranged at a side of the second conduction type semiconductor layer 132 adjacent to the one side region P1 of the second electrode layer 120 exposed thus, a side of the active layer 134, and a portion of a side of the first conduction type semiconductor layer 136. The protective layer 170 is arranged to cover at least the active layer 134, and, though the protective layer 170 can be arranged on an edge region of the top side of the first conduction type semiconductor layer 136 adjacent to the side of the light emitting structure 130, arrangement of the protective layer 170 is not limited to this. The protective layer 170 can prevent the electric short from taking place between the light emitting structure 130 and the second electrode pad 190.

Figure 2:
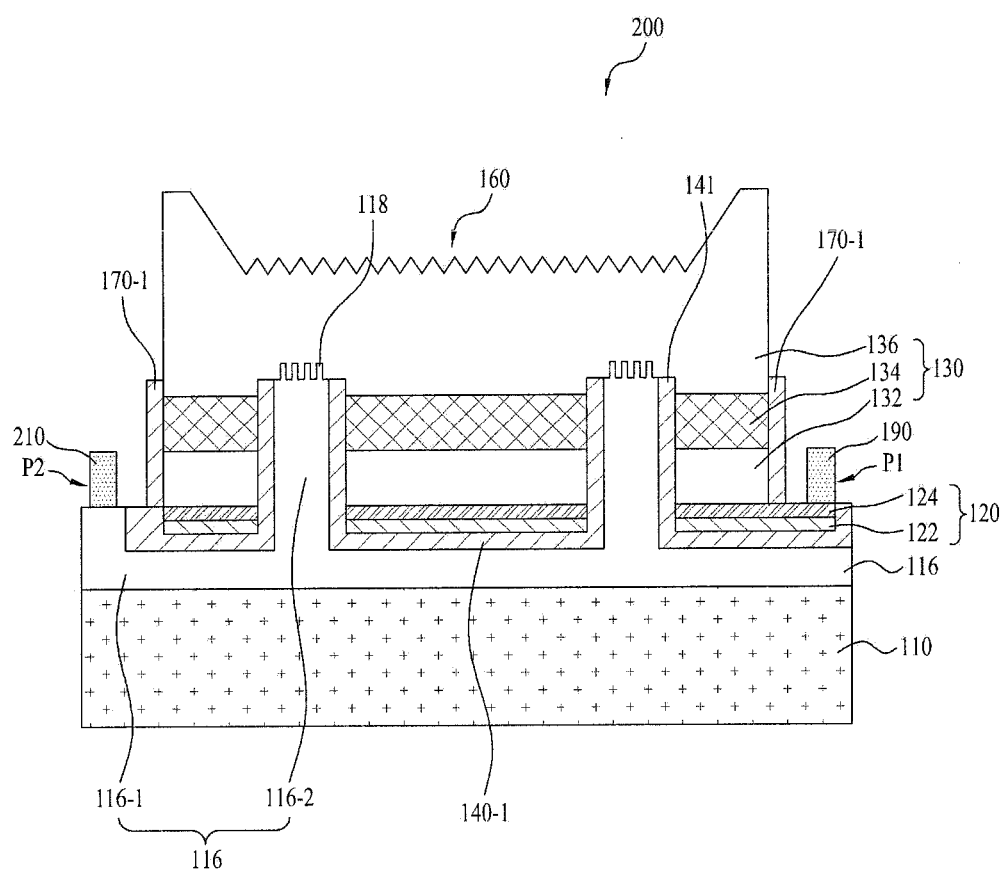
FIG. 2 illustrates a section of a light emitting device in accordance with another preferred embodiment of the present invention.

FIG. 2 illustrates a section of a light emitting device in accordance with another preferred embodiment of the present invention. Parts identical to the parts in the embodiment shown in FIG. 1 will be given identical reference numerals, and description of duplicated portions thereof will be omitted.

Referring to FIG. 2, the light emitting device 200 includes a support substrate 110, a first electrode layer 116, a second electrode layer 120, a light emitting structure 130, an insulating layer 140-1, a protective layer 170, a first electrode pad 210, and a second electrode pad 190.

The first electrode layer 116 has one side, for an example, one side of a lower electrode layer 116-1, exposed to an outside from the light emitting structure 130, and the first electrode pad 210 is arranged on the one side region P2 of the first electrode layer 116 exposed thus. The first electrode pad 210 can be singular or plural spaced from one another. There is a contact electrode 116-2 which can be identical to the contact electrode 115-2 in FIG. 2.

The second electrode layer 120 has one side, for an example, one side of the ohmic layer 124 or/and the reflective layer 122, exposed to an outside from the light emitting structure 130, and the second electrode pad 190 is arranged on one side region P1 of the second electrode layer 120 opened thus. In this instance, the one side region P1 of the second electrode layer 120 opened thus can be singular or plural, and can have a plurality of second electrode pads 190 provided thereto.

In this instance, while the one side exposed region P2 of the first electrode layer 116 is positioned adjacent to the one side of the light emitting structure 130, the one side exposed region P1 of the second electrode layer 120 can be positioned adjacent to the other side of the light emitting structure 130. However, the one side exposed region P2 of the first electrode layer 116 and the one side exposed region P1 of the second electrode layer 120 are not limited to this, but can be produced in different shapes.

There can be a protective layer 170-1 arranged around the light emitting structure 130, to cover at least sides of the second conduction type semiconductor layer 132 and the active layer 134. For an example, the protective layer 170-1 can be arranged at a side of the second conduction type semiconductor layer 132 adjacent to the one side region P1 of the second electrode layer 120 exposed thus and the one side region P2 of the first electrode layer 116 exposed thus, a side of the active layer 134, and a portion of one side of the first conduction type semiconductor layer 136. And, though the protective layer 170-1 can be arranged at an edge region of a top side of the first conduction type semiconductor layer 136 adjacent to the side of the light emitting structure 130 too, the arrangement of the protective layer 170-1 is not limited to this. The protective layer 170-1 prevents electric shorts from taking place between the first electrode pad 210 and the second electrode pad 190 and the light emitting structure 130 for preventing inter-layer shorts.

In the embodiment shown in FIG. 2, by arranging the first electrode pad 210 and the second electrode pad 190 on an outer side of the chip, wire bonding to the electrode pads 190 and 210 can be made simple. Moreover, since the first electrode pad 210 is not arranged on the first conduction type semiconductor layer 136, not reducing a size of the light emitting region of the top side of the first conduction type semiconductor layer 136, the optical extraction efficiency can be improved. And, since the power of a first polarity and a second polarity can be supplied through a lower side of the chip, a light emitting device having a new current path can be provided.

Figure 3:
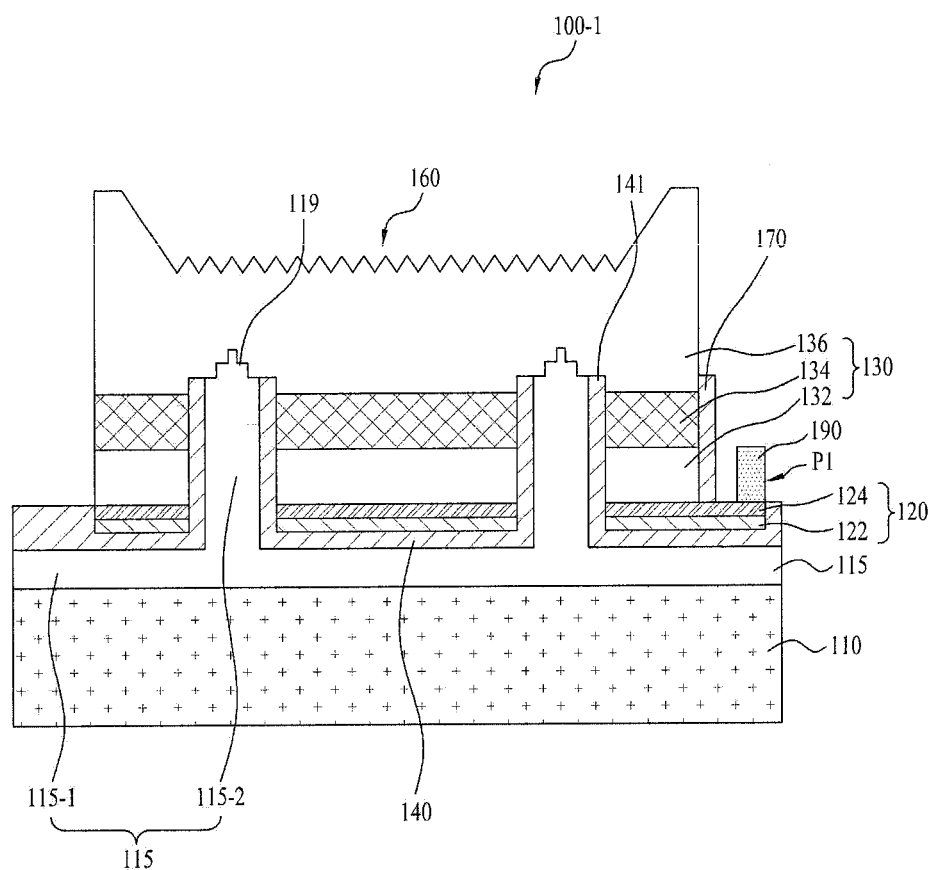
FIG. 3 illustrates a section of a light emitting device in accordance with another preferred embodiment of the present invention.

FIG. 3 illustrates a section of a light emitting device in accordance with another preferred embodiment of the present invention. Parts identical to the parts in the embodiment shown in FIG. 1 will be given identical reference numerals, and description of duplicated portions will be omitted.

Referring to FIG. 3, the contact electrode 115 has a top side with a stair structured roughness 119. A vertical direction section of the roughness 119 can have a two-tiered stair structure. In this instance, the vertical direction can be a direction facing from a top side of the contact electrode 115 toward a top side of the roughness 119. Though the roughness 119 in FIG. 3 shows a roughness 119 having a two-tiered stair structure from the top side of the contact electrode 115 to the top side of the roughness 119, the structure of the roughness 119 is not limited to this, but the roughness 119 can be more than two tiers.

Since the contact electrode 115-2 has the stair structured roughness 119 at the top side, increasing a contact area with the first conduction type semiconductor layer 136 dropping resistance of the first electrode layer 115, an operation voltage of the light emitting device 200 is improved, and reliability of the light emitting device 200 is improved as adhesion between the first electrode layer 115 and the first conduction type semiconductor layer 136 is increased.

Figure 5:
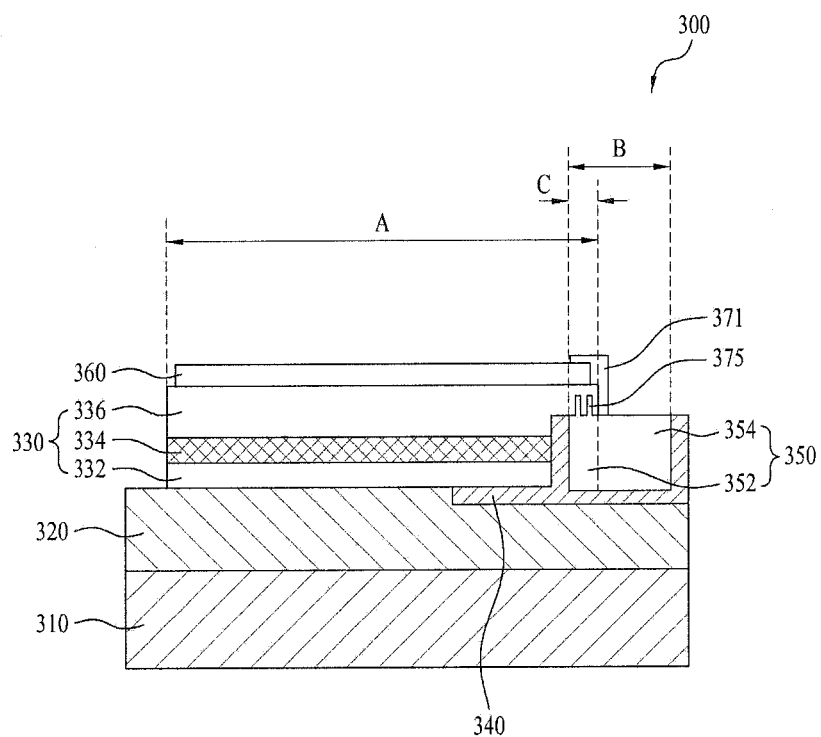
FIG. 5 illustrates a section of a light emitting device in accordance with another preferred embodiment of the present invention.

FIG. 5 illustrates a section of a light emitting device in accordance with another preferred embodiment of the present invention. As shown in FIG. 5, the light emitting device 300 includes a light emitting structure 330 having a second conduction type semiconductor layer 332, an active layer 334, and a first conduction type semiconductor layer 336, a second electrode layer 320 arranged under the light emitting structure 330 in contact with the second conduction type semiconductor layer 332, a first electrode layer 350 in contact with the first conduction type semiconductor layer 336 passed through the second conduction type semiconductor layer 332 and the active layer 334, and an insulating layer 340 arranged between each of the second electrode layer 320, between the second conduction type semiconductor layer 332, and the active layer 134, and between the first electrode layer 115, wherein a portion of the first electrode layer 350 in contact with the first conduction type semiconductor layer 336 has a roughness 375.

The second electrode layer 330 can be embodied as single layer or multiple layers of at least one selected from ITO, IZO, IZTO, IAZO, IGZO, IGTO, AZO, ATO, GZO, IrOx, RuOx, RuOx/ITO, Ni, Ag, Ni/IrOx/Au, and Ni/IrOx/Au/ITO.

And, the second electrode layer 320 can be formed of Ag, Ni, Al, Rh, Pd, Ir, Ru, Mg, Zn, Pt, Au, Hf and a selective combination of above materials for reflection. And, the second electrode layer 320 can be constructed as multiple layers of light transmissive conductive material, such as IZO, IZTO, IAZO, IGZO, IGTO, AZO, ATO together with above metals. For an example, the second electrode layer 320 can be a stack of IZO/Ni, AZO/Ag, IZO/Ag/Ni, or AZO/Ag/Ni. The second electrode layer 320 can be a bonded layer having a barrier metal and a bonding metal. For an example, the second electrode layer 320 can include at least one of Ti, Au, Sn, Ni, Cr, Ga, In, Bi, Cu, Ag or Ta.

The light emitting structure 330 is arranged on a first region A of the second electrode layer 320, and includes the second conduction type semiconductor layer 332, the active layer 334, and the first conduction type semiconductor layer 336. The second conduction type semiconductor layer 332, the active layer 334, and the first conduction type semiconductor layer 336 are identical to ones described with reference to FIG. 1.

There is a conductive layer 360 arranged on the first conduction type semiconductor layer 336, and the conductive layer 360 is formed of a light transmissive material selected from oxides or nitrides, for an example, ITO, IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide).

The first electrode layer 350 is arranged on a second region B of the second electrode layer 320 such that a portion thereof overlaps with the light emitting structure 330. A top side of the portion of the first electrode layer 350 overlapping with the light emitting structure 330 is in contact with the first conduction type semiconductor layer 336. In this instance, the top side of the first electrode layer 350 in contact with the first conduction type semiconductor layer 336 can position higher than the active layer 334.

The first electrode layer 350 includes a contact portion 352 and an exposed portion 354. The contact portion 352 can be a portion in contact with the first conduction type semiconductor layer 336 passed through the second conduction type semiconductor layer 332 and the active layer 334 adjacent to one side of the light emitting structure 330 and overlapped with the light emitting structure 330 in a vertical direction. The exposed portion 354 can be a portion not overlapped with the light emitting structure 330 in a vertical direction and exposed from the light emitting structure 330.

The top side of the contact portion 352 has a roughness 375 in contact with the first conduction type semiconductor layer 336. In this instance, the roughness 375 can have a regular or an irregular pattern. The roughness 375 can have a shape identical to the roughness 118 in FIG. 1 or the roughness 119 in FIG. 3.

The insulating layer 340 is arranged between the first electrode layer 350 and the second electrode layer 320 for electric insulation of the first electrode layer 350 from the second electrode layer 320. The insulating layer 340 is arranged between a side of the contact portion 352 and a passed through portion of the second conduction type semiconductor layer 332 and between a side of the contact portion 352 and a passed through portion of the active layer 334 for insulating the contact portion 352 from the second conduction type semiconductor layer 332 and the active layer 334. And, the insulating layer 340 is formed to surround a portion of first electrode layer 350 excluding a top side thereof, i.e., sides and a bottom of the first electrode layer 350 for electric insulation of the first electrode layer 350 from other layers 320, 332, and 334.

The embodiment shown in FIG. 5 increases a contact area between the contact portion 352 and the first conduction type semiconductor layer 336 owing to the roughness 375, enabling to improve the operation voltage and reliability of the light emitting device as described with reference to FIG. 1, in detail.

Moreover, as the first electrode layer 350 is arranged not on the first conduction type semiconductor layer 336, but below one side of the first conduction type semiconductor layer 336, the embodiment shown in FIG. 5 does not interfere with a photon traveling in a vertical direction, thereby enabling to improve light emission efficiency of the light emitting device 300.

There is a contact electrode 371 arranged on the exposed portion 354 of the first electrode layer 350, one side the first conduction type semiconductor layer 336 adjacent to the exposed portion 354, and the conductive layer 360. The contact electrode 371 can have one side portion in direct contact with the exposed portion 354 of the first electrode layer 350, and the other side portion in direct or indirect contact with the first conduction type semiconductor layer 336 or/and the conductive layer 360. The first electrode layer 350 can be in contact with the contact electrode 371 or the conductive layer 360 for making smooth distribution and supply of a current to the first conduction type semiconductor layer 336.

Figure 6:
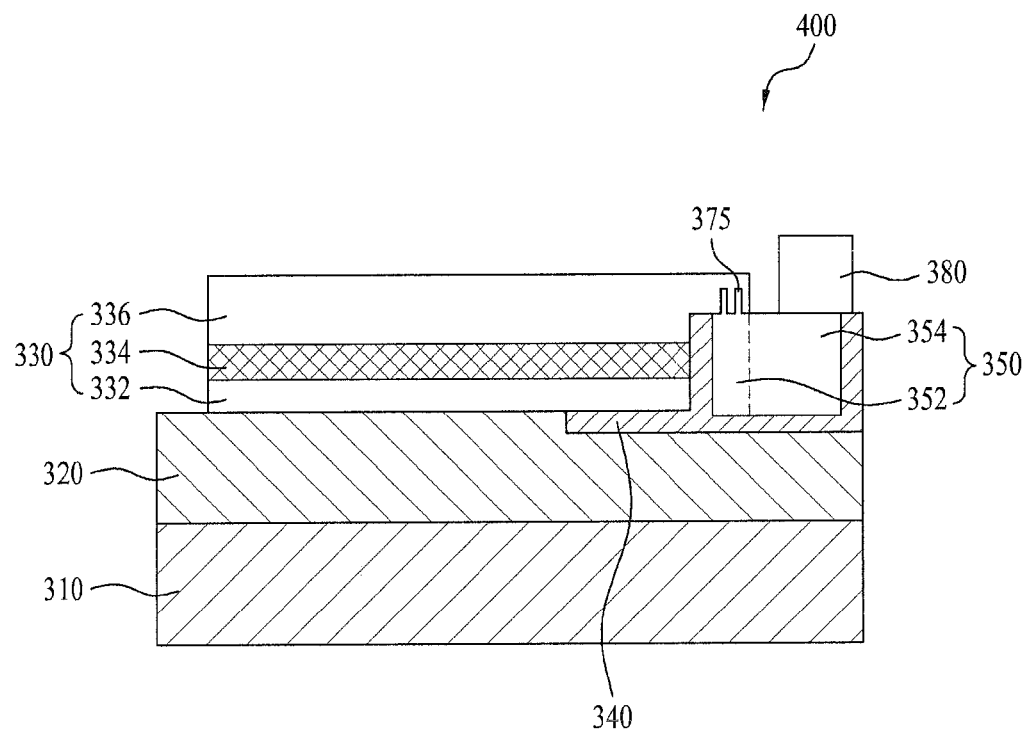
FIG. 6 illustrates a section of a light emitting device in accordance with another preferred embodiment of the present invention.

FIG. 6 illustrates a section of a light emitting device in accordance with another preferred embodiment of the present invention. Parts identical to the embodiment described with reference to FIG. 5 will have identical reference numerals and description of duplicated portion will be omitted.

Referring to FIGS. 5 and 6, the light emitting device 400 includes a first electrode pad 380 arranged on the first electrode layer 350, additionally. For an example, the first electrode pad 380 can be arranged on the exposed portion 354 of the first electrode layer 350.

Though the light emitting device 400 shown in FIG. 6 has the contact electrode 371 omitted therefrom, the contact electrode 371 may not be omitted in other embodiment.

The first electrode pad 380 can have a size, a position, and a shape varied with an area of the first electrode layer 350. The first electrode pad 380 can be formed of a material identical to the first electrode layer 350 or can have gold Au for bonding, additionally.

Figure 7:
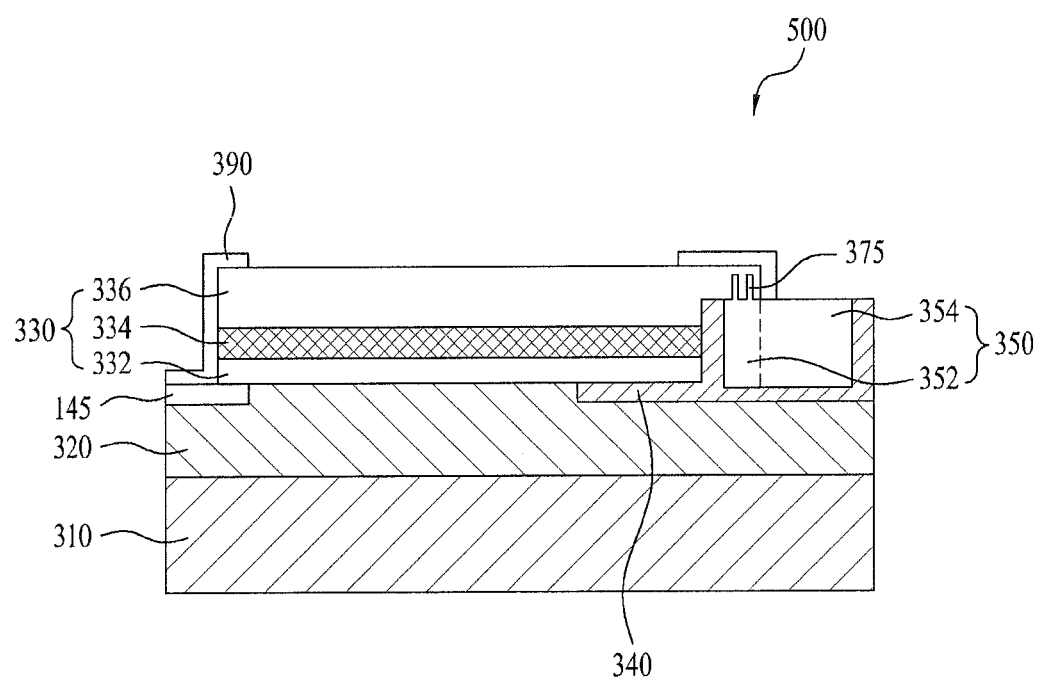
FIG. 7 illustrates a section of a light emitting device in accordance with another preferred embodiment of the present invention.

FIG. 7 illustrates a section of a light emitting device in accordance with another preferred embodiment of the present invention. Parts identical to the embodiment described with reference to FIG. 5 will have identical reference numerals, and description of duplicated portion will be omitted.

Referring to FIG. 7, the semiconductor light emitting device 500 has a structure in which a channel layer 145 is added to the structure in FIG. 6. The channel layer 145 is arranged on an edge region of the second electrode layer 320. The channel layer 145 has a portion arranged between the second electrode layer 320 and the second conduction type semiconductor layer 332 vertically overlapped with the light emitting structure 330 and the other portion not overlapped with the light emitting structure 330.

The channel layer 145 can be a continuous pattern of a band, a ring, a frame or a loop with a predetermined width (For an example, below 2 μm), constructed of single or multiple layers of identical or different materials.

The channel layer 145 can be formed of a light transmissive material selected from oxides or nitrides or insulating layer materials. For an example, the channel layer 145 can be selected from ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, $TiO_2$.

The channel layer 145 can be formed of a material identical or different from the insulating layer 340. In this instance, if the channel layer 145 is formed of a material identical to the insulating layer 340, the channel layer 145 can be formed at the same step with the insulating layer 340.

The channel layer 145 can prevent interlayer short circuit at a side wall of the light emitting structure 330 from taking place. The channel layer 145 can prevent moisture from infiltrating into the side wall of the light emitting structure 330 and can improve electric reliability of the side wall of the light emitting structure 330. And, as a critical angle of the light incident on the channel layer 145 changes, the optical extraction efficiency of the light emitting device can be improved.

There is a passivation layer 390 arranged on a side of the light emitting structure 330 for electric protection. For an example, the passivation layer 390 can be arranged to surround sides of the second conduction type semiconductor layer 332, the active layer 334, and the first conduction type semiconductor layer 336. Though the passivation layer 390 can be formed of an insulating material, such as $SiO_2$, $SiO_x$, $SiO_xN_y$, $Si_3N_4$, $Al_2O_3$, the material is not limited to above.

Figure 8:
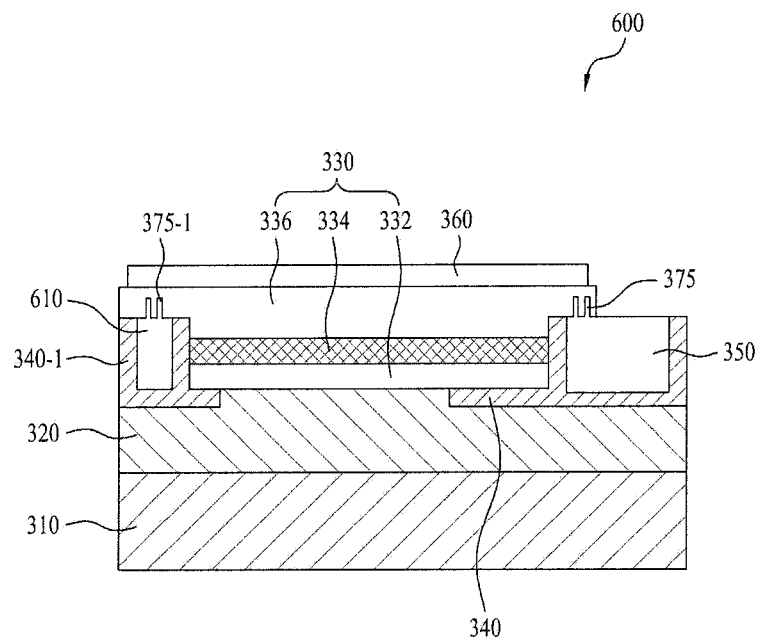
FIG. 8 illustrates a section of a light emitting device in accordance with another preferred embodiment of the present invention.
Figure 9:
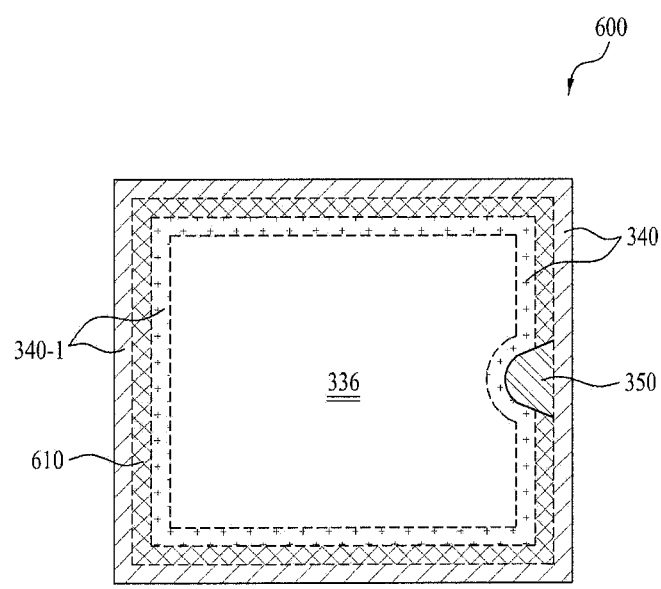
FIG. 9 illustrates a plan view of the light emitting device in FIG. 8.

FIG. 8 illustrates a section of a light emitting device 600 in accordance with another preferred embodiment of the present invention, and FIG. 9 illustrates a plan view of the light emitting device 600 in FIG. 8. Parts identical to the embodiment described with reference to FIG. 5 will have identical reference numerals, and description of duplicated portions will be omitted.

Referring to FIG. 8, the light emitting device 600 includes a support substrate 310, a second electrode layer 320, a light emitting structure 330, insulating layers 340 and 340-1, a conductive layer 360, and an internal contact electrode 610.

The first electrode layer 350 has the internal contact electrode 610. For an example, the internal contact electrode 610 can be a horizontal branch from the first electrode layer 350 to position in the light emitting structure 330, and have a top side in contact with the first conduction type semiconductor layer 336. The internal contact electrode 610 in the light emitting structure 330 can have a shape not limited to above, but can have different shapes.

The top side of the internal contact electrode 610 has a roughness 375-1. In this instance, the roughness 375-1 can have a regular or an irregular pattern. The roughness 375-1 can be identical to the roughness 118 in FIG. 1 or the roughness 119 in FIG. 3.

Accordingly, the roughness 375-1 increases a contact area between the internal contact electrode 610 and the first conduction type semiconductor layer 336, enabling to improve the operation voltage and reliability of the light emitting device 600 as described with reference to FIG. 1.

The insulating layer 340-1 insulates the internal contact electrode 610 from other layers 320, 332, and 334. For an example, the insulating layer 340-1 can be arranged to surround sides and a bottom of the internal contact electrode 610 excluding a top side of the internal contact electrode 610.

The first electrode layer 350 and the internal contact electrode 610 are connected to each other, and the internal contact electrode 610 can have a ring shape, a loop shape, a frame shape when seen from above. Though the internal contact electrode 610 can have a closed loop shape as shown in FIG. 9, or an open loop in another embodiment. The first electrode layer 350 and the internal contact electrode 610 can supply a uniform current to an outside circumference of the first conduction type semiconductor layer 336, thereby improving current supply efficiency.

And, since an edge region of the first conduction type semiconductor layer 336 is arranged on the insulating layer 340-1 and the internal contact electrode 610, the insulating layer 340-1 and the internal contact electrode 610 are not exposed to an outside when seen from a top side of a chip. Therefore, since the internal contact electrode 610 of the first electrode layer 350 is not exposed from the top side of the chip, permitting to maintain an upper side size of the first conduction type semiconductor layer 336, reduction of the light extraction region can be prevented.

Figure 10:
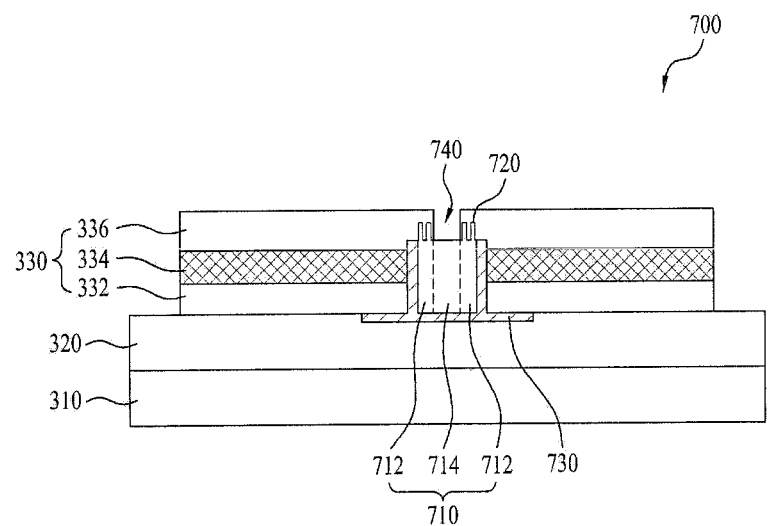
FIG. 10 illustrates a section of a light emitting device in accordance with another preferred embodiment of the present invention.
Figure 11:
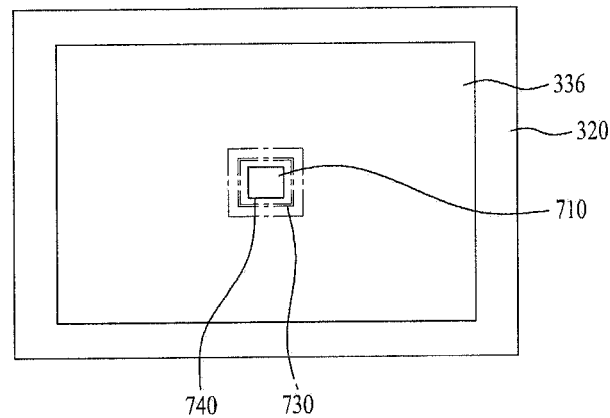
FIG. 11 illustrates a plan view of the light emitting device in FIG. 10.

FIG. 10 illustrates a section of a light emitting device in accordance with another preferred embodiment of the present invention, and FIG. 11 illustrates a plan view of the light emitting device in FIG. 10. Referring to FIGS. 10 and 11, the light emitting device 700 includes a support substrate 310, a second electrode layer 320, a light emitting structure 330, a first electrode layer 710, and an insulating layer 730.

The second electrode layer 320 is arranged on the support substrate 310, and the light emitting structure 330 is arranged on the second electrode layer 320. The first electrode layer 710 has a structure in which the first electrode layer 710 is arranged in the light emitting structure 330 at a chip center region. The first electrode layer 710 can be arranged at the chip center region on the second electrode layer 320, and the light emitting structure 330 can have a structure in which the light emitting structure 330 surrounds sides and a top side of the first electrode layer 710. In this instance, the light emitting structure 330 can expose a portion of the top side of the first electrode layer 710, and the exposed top side of the first electrode layer 710 can be positioned higher than a top side of the active layer 334 and lower than a top side of the first conduction type semiconductor layer 336.

For an example, the first electrode layer 710 can be in contact with the first conduction type semiconductor layer 336 passed through the second conduction type semiconductor layer 332, and the active layer 334 at the center region of the light emitting structure 330. And, a center region of the first conduction type semiconductor layer 336 can have an opening 740 which exposes a portion of the top side of the first electrode layer 710. The opening 740 can be a region for making electric pattern contact, or wire bonding.

The first electrode layer 710 can include a contact portion 712 in contact with the first conduction type semiconductor layer 336 passed through the second conduction type semiconductor layer 332 and the active layer 334, and an exposed portion 714 exposed from the first conduction type semiconductor layer 336 by the opening 740. In this instance, the exposed portion 714 can be a center portion of the first electrode layer 710, and the contact portion 712 can be an outer portion of the first electrode layer 710.

The top side of the contact portion 712 in contact with the first conduction type semiconductor layer 336 can have a roughness 720. The roughness 720 can have a regular pattern or an irregular pattern. The roughness 720 can be identical to the roughness 118 in FIG. 2 or the roughness 119 in FIG. 3.

The insulating layer 730 is arranged around the first electrode layer 710 for insulating the first electrode layer 710 from other layers 320, 332, and 336. For an example, the insulating layer 730 can be arranged to surround sides and a bottom of the first electrode layer 710 excluding the top side thereof.

The insulating layer 730 on an underside of the first electrode layer 710 can have extensions to an interface between the second conduction type semiconductor layer 332 and the second electrode layer 320 adjacent to the first electrode layer 710. Since the partial extensions of the insulating layer 730 can prevent a current flowing from the second electrode layer 320 to the first electrode layer 710 from concentrating on a particular region of the light emitting structure 330, the partial extensions can serve as a current blocking layer. Since the first electrode layer 710 can supply a current from the center region of the first conduction type semiconductor layer 336, spreading of the current to an entire region of the light emitting structure 330 can be easy.

Figure 12:
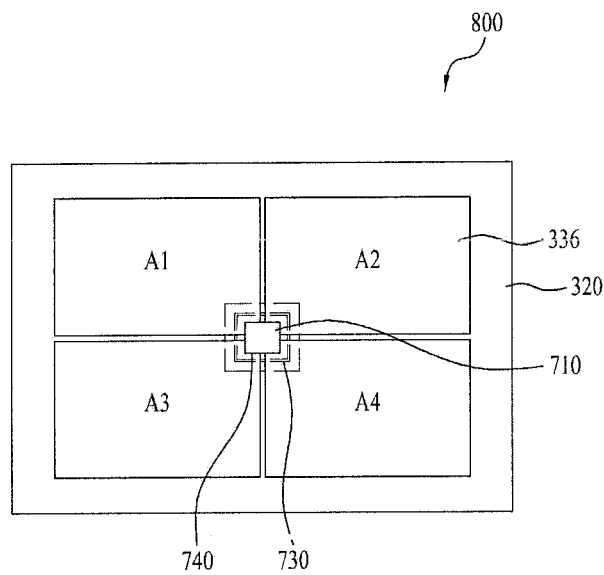
FIG. 12 illustrates a plan view of a light emitting device in accordance with another preferred embodiment of the present invention.

FIG. 12 illustrates a plan view of a light emitting device 800 in accordance with another preferred embodiment of the present invention. Parts identical to the parts in the embodiment shown in FIG. 11 will be given identical reference numerals, and description of duplicated portions thereof will be omitted.

Referring to FIG. 12, the light emitting structure 800 can have a plurality of cell regions (for an example, two or more than two) which are divisions of the light emitting device 330. FIG. 12 illustrates a plan view showing the four cell regions A1 A2, A3, and A4 arranged on the second electrode layer 320 spaced from one another by predetermined distances.

The embodiment shown in FIG. 12 can be identical to a structure of the light emitting structure 700 shown in FIG. 11 except that the light emitting structure 330 has four cell regions spaced from one another by predetermined distances.

The first electrode layer 710 is arranged in the light emitting structure 330 at a chip center region, and the first conduction type semiconductor layer 336 of each of the plurality of the cell regions A1, A2, A3, and A4 has an opening 740 which exposes a portion of the first electrode layer 710. For an example, the opening 740 can be positioned at a first corner of each of the cell regions A1, A2, A3, and A4. In this instance, the first corner can be a corner positioned at the chip center region.

That is, the first electrode layer 710 includes a contact portion in contact with the first conduction type semiconductor layer 336 passed through the second conduction type semiconductor layer 332 and the active layer 334 of each of the plurality of cell regions A1, A2, A3, and A4 arranged at the center region of the light emitting structure 330, and an exposed portion exposed from the first conduction type semiconductor layer 336 by the opening 740.

The contact portion at a top side of the first electrode layer 710 in contact with the first conduction type semiconductor layer 336 has a roughness (not shown). In this instance, the roughness can be identical to the roughness 118 in FIG. 1 or the roughness 119 in FIG. 3.

There can be an insulating layer (not shown) arranged between the plurality of the cell regions A1, A2, A3, and A4, for insulating a space between each of adjacent cell regions A1, A2, A3, and A4. In this instance, a contact electrode connected to the first electrode layer 710 is arranged on the insulating layer on each of adjacent cell regions A1, A2, A3, and A4 for efficient supply of power.

Figure 13:
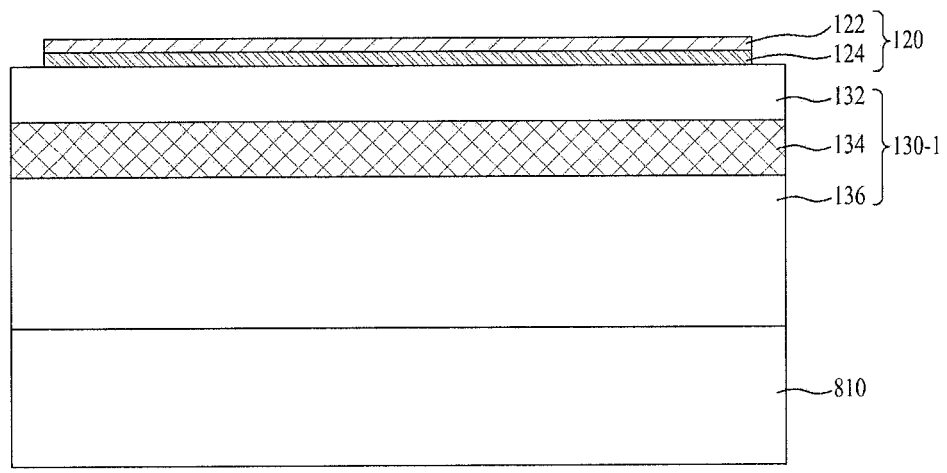
FIGS. 13~17 illustrate sections showing the steps of a method for fabricating a light emitting device in accordance with a preferred embodiment of the present invention.

FIGS. 13~17 illustrate sections showing the steps of a method for fabricating a light emitting device in accordance with a preferred embodiment of the present invention. Referring to FIG. 13, a light emitting structure 130-1 is grown on a growth substrate 810. The growth substrate 810 can be formed of at least one selected from sapphire $Al_2O_3$, SiC, GaAs, GaN, ZnO, Si, GaP, InP, Ge, but the present invention does not limit above materials. A buffer layer (not shown) or/and an undoped nitride layer (not shown) can also be formed between the light emitting structure 130-1 and the growth substrate 810 for moderating a lattice constant.

The light emitting structure 130-1 can be formed by growing a first conduction type semiconductor layer 136, an active layer 134, and a second conduction type semiconductor layer 132 on the growth substrate 810 in succession. The light emitting structure 130-1 can be formed by, for an example, MOCVD; Metal Organic Chemical Vapor Deposition, CVD; Chemical Vapor Deposition), PECVD; Plasma-Enhanced Chemical Vapor Deposition, MBE; Molecular Beam Epitaxy, HVPE; Hydride Vapor Phase Epitaxy and the like, but the present invention does not limit to this.

And, a second electrode layer 120 is formed on the second conduction type semiconductor layer 132. The second electrode layer 120 can have one of shapes of ohmic layer/reflective layer/bonding layer, ohmic layer/reflective layer, or reflective layer/bonding layer, but the shape is not limited to this. For an example, the ohmic layer 124 can be formed on the second conduction type semiconductor layer 132, and the reflective layer 122 can be formed on the ohmic layer 124.

The ohmic layer 124 and the reflective layer 122 can be formed by, for an example, one of E-beam deposition, Sputtering, and PECVD Plasma Enhanced Chemical Vapor Deposition. An area of each of the ohmic layer 124 and the reflective layer 122 can be selected variously.

Figure 14:
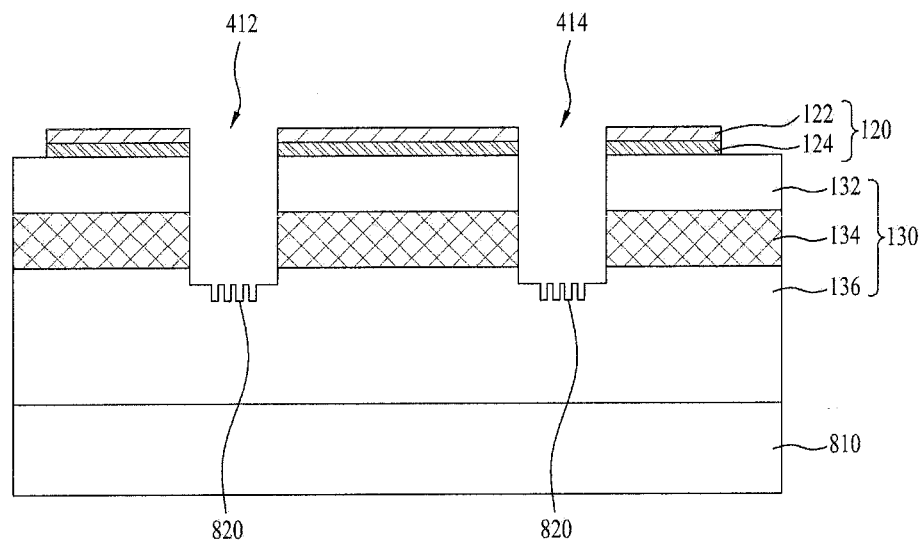

Next, referring to FIG. 14, at least one recess or hole 412 and 414 is formed to pass through the second electrode layer 120, the second conduction type semiconductor layer 132, and the active layer 134 to expose the first conduction type semiconductor layer 136. In this instance, the at least one recess or hole 412 and 414 has a bottom with a regular or an irregular roughness 820.

For an example, by using photolithography and etching, the second electrode layer 120 is etched selectively to expose a portion of the second conduction type semiconductor layer 132, and an exposed second conduction type semiconductor layer 132 and the active layer 134 under the active layer 134 are etched to form the at least one recess or hole 412 and 414 which exposes the first conduction type semiconductor layer 136.

Then, the first conduction type semiconductor layer 136 exposed by the recess or hole 412 and 414 can be subjected to dry etching or PEC Photo Electro Chemical etching to form a regular or an irregular roughness 820 at a bottom of the recess or hole 412 and 414.

Figure 15:
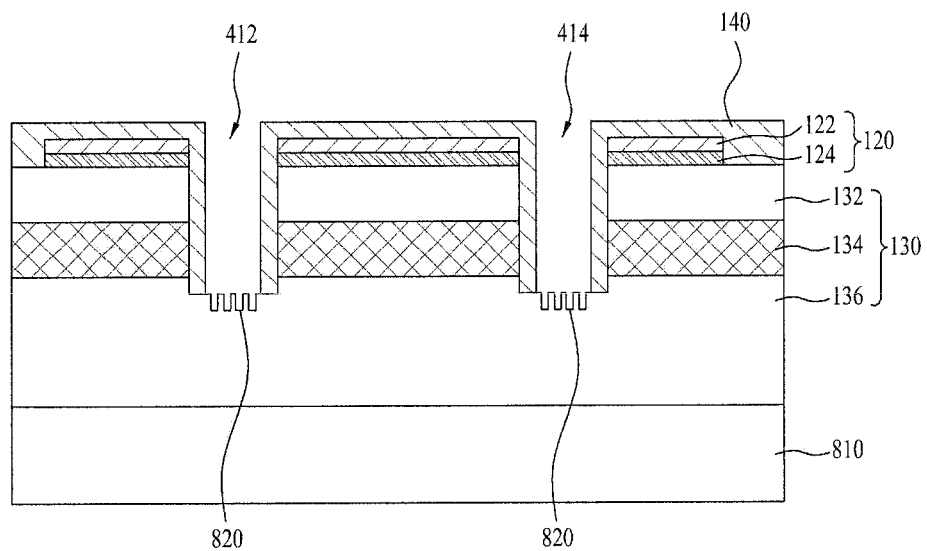

Next, referring to FIG. 15, an insulating layer 140 is formed on the second electrode layer 120 and sides of the at least one recess or hole 412 and 414. In this instance, the insulating layer 140 is not formed at the bottom of the recess or hole 412 and 414 having the roughness 820. And, the insulating layer 140 can be formed on an edge region of the second conduction type semiconductor layer 132 to surround the sides of the second electrode layer 120.

Figure 16:
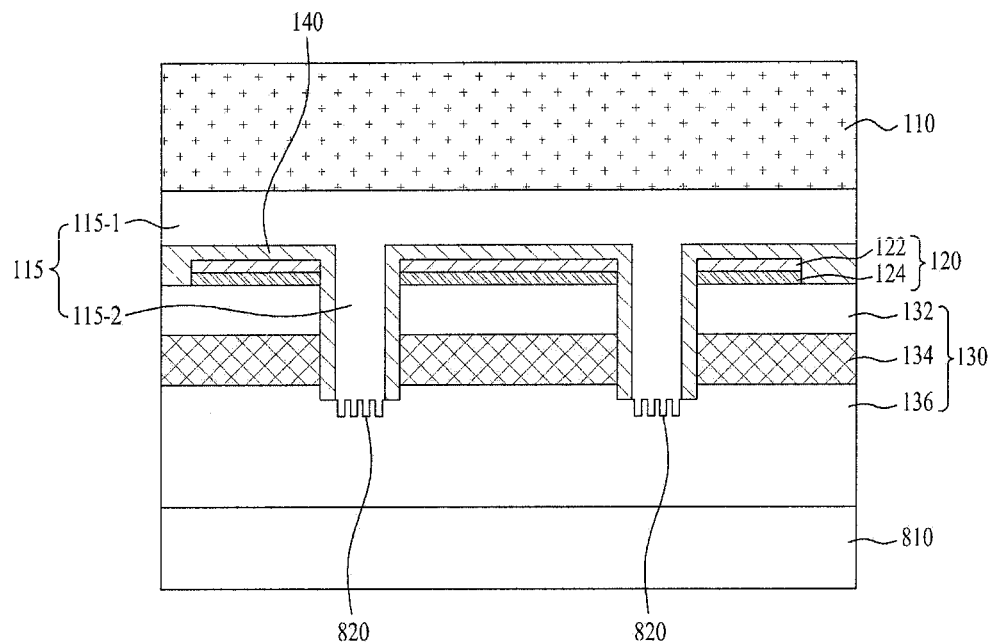

Next, referring to FIG. 16, a first electrode layer 115 is formed on the insulating layer 140 to fill the at least one recess or hole 412 and 414 with a conductive material to be in contact with the first conduction type semiconductor layer 136 exposed thus. In this instance, the conductive material is filled in recess portions of the roughness 820 in the recess or hole 412 and 414, too. In this instance, the first electrode layer 115 filled in the recess or hole 412 and 414 becomes a contact electrode 115-2, and the first electrode layer 115 on the insulating layer 140 on the second electrode layer 120 becomes a lower electrode layer 115-1.

Then, a support substrate 110 is formed on the first electrode layer 115. In this instance, the support substrate 110 can be formed by bonding, plating, or deposition.

Figure 17:
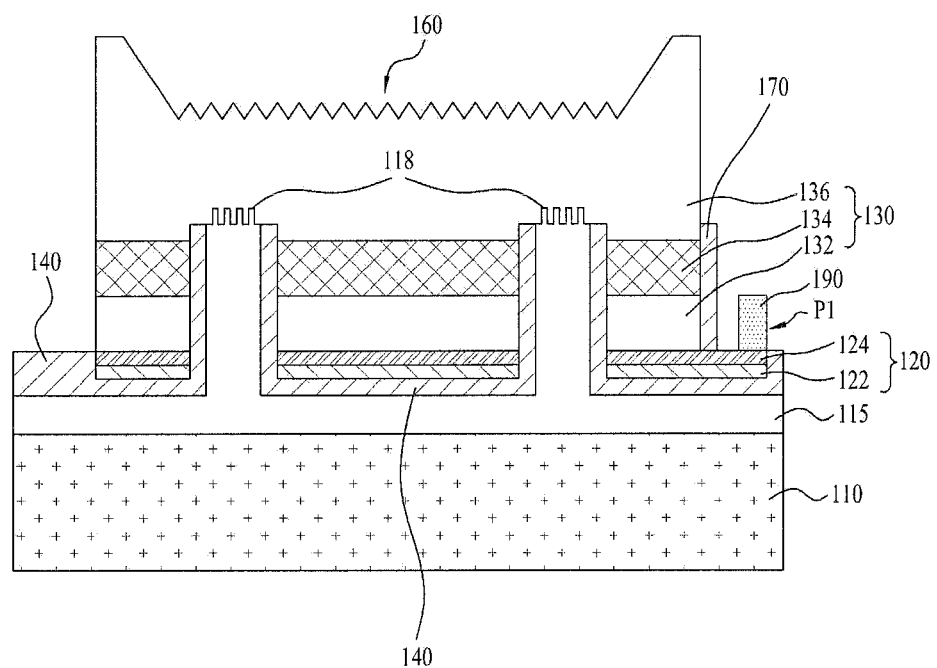

Next, referring to FIG. 17, the growth substrate 810 is removed from the light emitting structure 130-1 by using Laser Lift Off or Chemical Lift Off. FIG. 17 illustrates the structure in FIG. 16 in an upside down position.

And, along unit chip regions, the light emitting structure 130-1 is subjected to isolation etching to separate a plurality of light emitting structures. For an example, the isolation etching can be made by dry etching, like ICP (Inductively Coupled Plasma). The isolation etching opens a portion of the second electrode layer 120 from the light emitting structure 130. For an example, the isolation etching can open a portion of an edge of the second electrode layer 120 as the light emitting structure 130 is etched by the isolation etching.

Then, a passivation layer 170 is formed to cover sides of the light emitting structure 130. Though the passivation layer 170 can be formed to cover the sides of the light emitting structure 130 which fall at least under the second conduction type semiconductor layer 132 and the active layer 134, but not limited to this, and the passivation layer 170 can be formed to cover the sides and a top side of the light emitting structure 130. Then, a roughness 160 is formed on the top side of the first conduction type semiconductor layer 136. And, a second electrode pad 190 is formed on the second electrode layer 120 opened thus.

Figure 18:
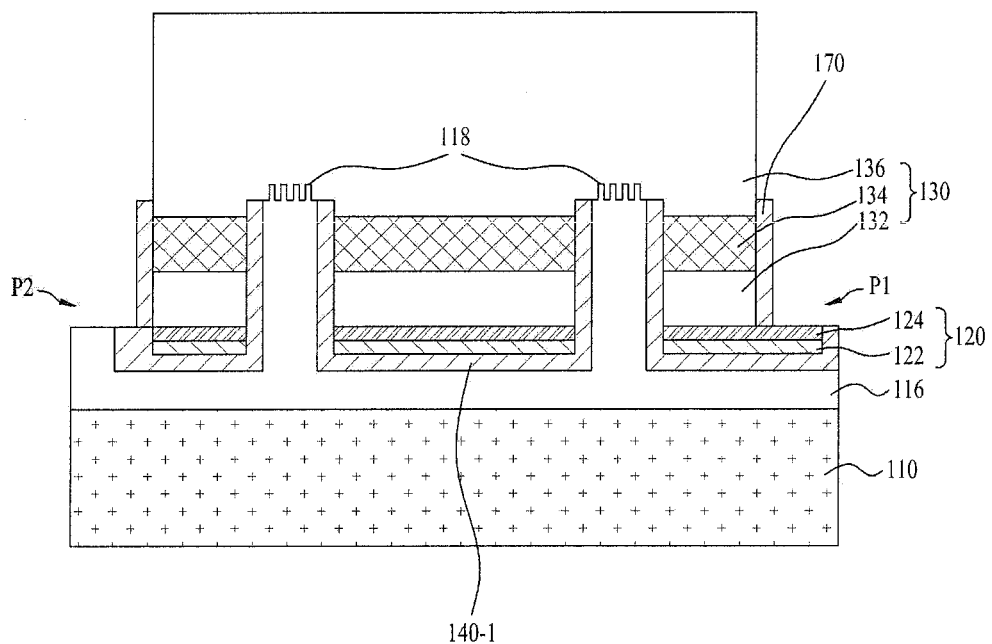
FIGS. 18 and 19 illustrate sections showing the steps of a method for fabricating a light emitting device in accordance with another preferred embodiment of the present invention.
Figure 19:
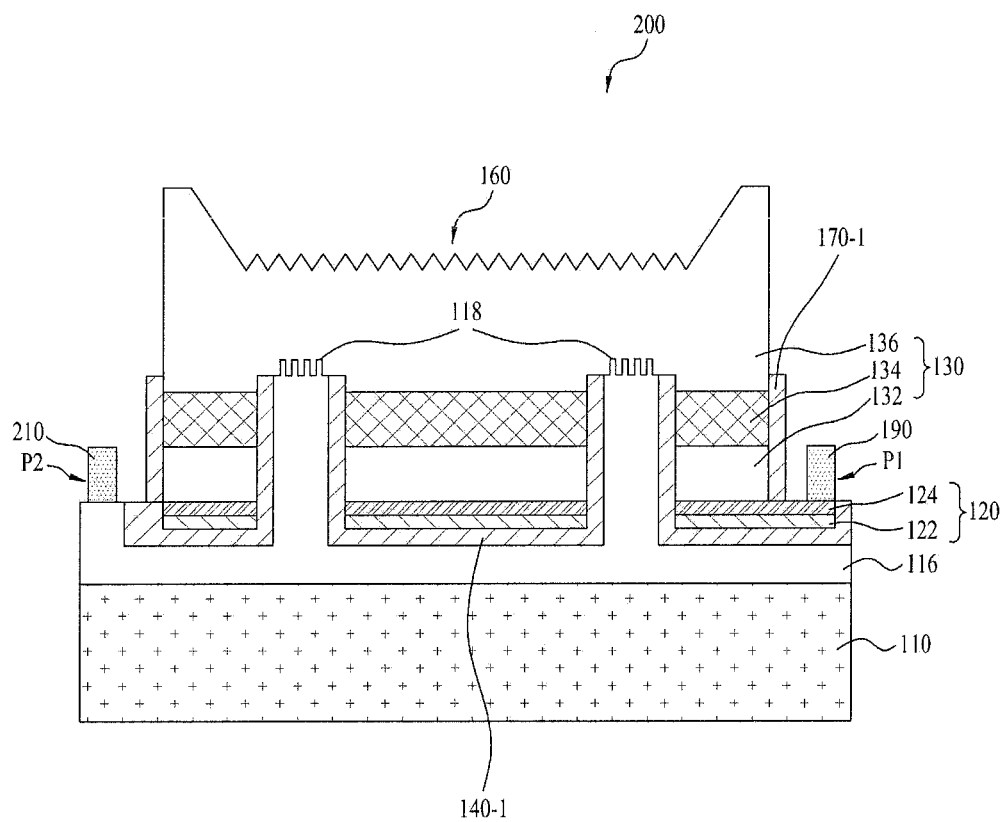

FIGS. 18 and 19 illustrate sections showing the steps of a method for fabricating a light emitting device in accordance with another preferred embodiment of the present invention.

At first, the steps illustrated in FIGS. 13 and 16 are carried out. However, in FIG. 15, the insulating layer 140 does not cover all the second conduction type semiconductor layer 132 adjacent to the one side of the second electrode layer 120, but is formed to expose one side edge region of the second electrode layer 120.

According to this, as shown in FIG. 18, an open region P2 of the first electrode layer 115 on the other side of the light emitting structure 130 has a height the same with the second electrode layer 120. However, the embodiment is not limited to this, but the open region P2 of the first electrode layer 115 can be embodied in a various shapes.

Referring to FIG. 18, after removing the growth substrate 810 from the light emitting structure 130, the isolation etching is performed, to open a portion of the second electrode layer 120 and a portion of the first electrode layer 115. For an example, the isolation etching can open a portion P1 of the second electrode layer 120 on one side of the light emitting structure 130, and the region P2 of the first electrode layer 115 on the other side of the light emitting structure 130. Then, a passivation layer 170 is formed which covers the sides of the light emitting structure 130.

Next, referring to FIG. 19, a first electrode pad 210 is formed on one region P2 of the first electrode layer 115 opened thus, and a second electrode pad 190 is formed on one region P1 of the second electrode layer 120 opened thus, for an example, on one region P1 of the ohmic layer 124 or the reflective layer 122 opened thus. The open regions P1 and P2 can be singular or plural, and a plurality of the first electrode pads 210 and/or the second electrode pads 190 can be formed. And, a roughness pattern 160 is formed on a top side of the first conduction type semiconductor layer 136.

Figure 20:
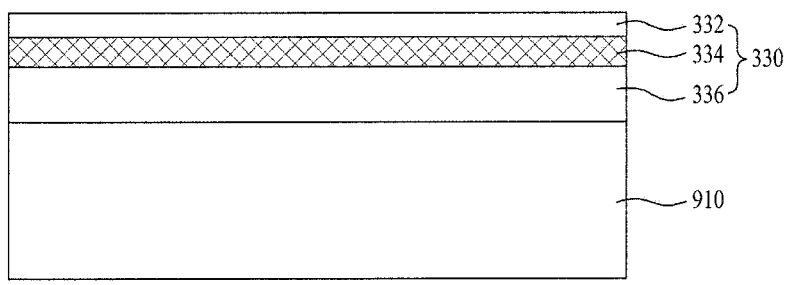
FIGS. 20-25 illustrate sections showing the steps of a method for fabricating a light emitting device in accordance with another preferred embodiment of the present invention.
Figure 25:
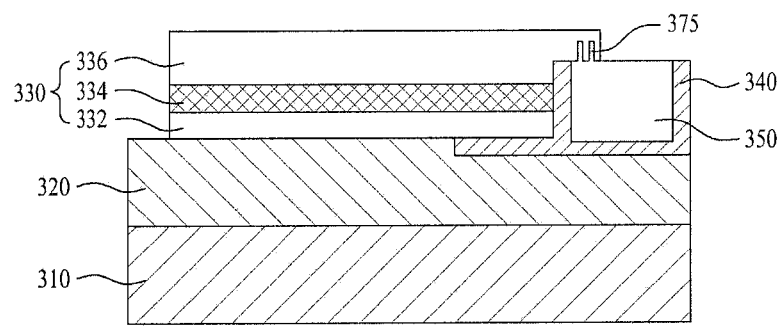

FIGS. 20 and 25 illustrate sections showing the steps of a method for fabricating a light emitting device in accordance with another preferred embodiment of the present invention.

Referring to FIG. 20, a light emitting structure 330 is formed on a growth substrate 910 of a compound semiconductor of group 2~6 elements. For an example, a first conduction type semiconductor layer 336, an active layer 334, and a second conduction type semiconductor layer 332 are formed on the growth substrate 910. In this instance, the first conduction type semiconductor layer 336, the active layer 334, and the second conduction type semiconductor layer 332 can be identical to the first conduction type semiconductor layer 136, the active layer 134, and the second conduction type semiconductor layer 132 described in FIG. 1.

A roughness (not shown) can be formed on the growth substrate 910. And, a layer or a pattern of a compound semiconductor of group 2~6 elements, for an example, at least one of a ZnO layer (not shown), a buffer layer (not shown), and an undoped semiconductor layer (not shown) can be formed between the growth substrate 910 and the light emitting structure 330. The buffer layer or the undoped semiconductor layer can be formed of a compound semiconductor of group 3~5 elements, and the undoped semiconductor layer can be formed of an undoped GaN group semiconductor.

Next, photolithography is performed to form a mask (not shown) on the light emitting structure 330, and a portion of the light emitting structure 330 is etched by using the mask as an etching mask, to form an opened portion 915 which exposes a portion of the first conduction type semiconductor layer 336. For an example, by etching a portion of each of the second conduction type semiconductor layer 332, the active layer 334, and the first conduction type semiconductor layer 336, the opened portion 915 can be formed, which exposes a portion of the first conduction type semiconductor layer 336. In this instance, the exposed portion of the first conduction type semiconductor layer 336 can be formed lower than the active layer 334. And, though the opened portion 915 can be formed at one side edge region of a unit chip, the position is not limited to this.

Then, the exposed portion 918 of the first conduction type semiconductor layer 336 is subjected to dry or PEC etching, to form a roughness 920. In this instance, the roughness 920 can be formed spaced from a predetermined distance from a side 919 of the light emitting structure 330 etched thus.

Figure 21:
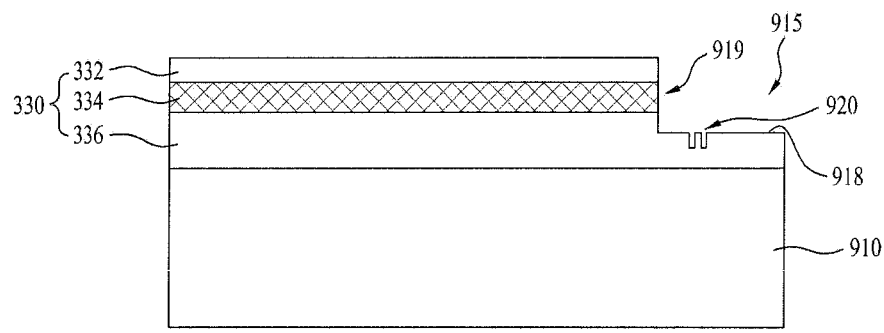
Figure 22:
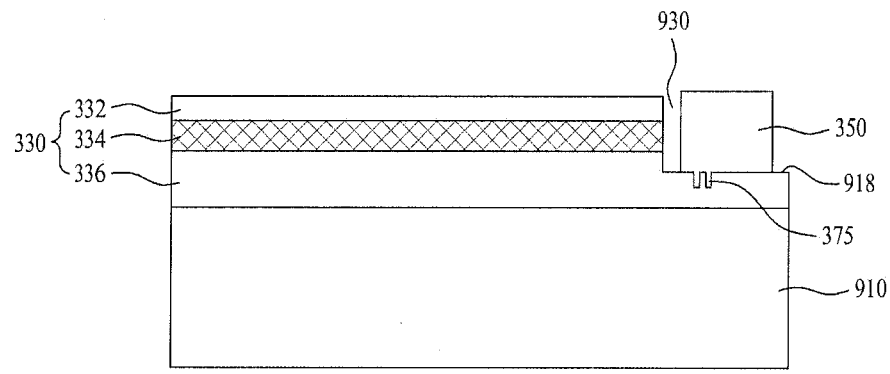

Next, referring to FIG. 22, a first electrode layer 350 is formed at the exposed portion of the first conduction type semiconductor layer 336 having the roughness 920 formed therein. In this instance, a portion of the first electrode layer 350 can be formed on the roughness 920, and the first electrode layer 350 can be formed to have a predetermined gap 930 between the first electrode layer 350 and the side 919 (See FIG. 21) spaced from the side 919 of the light emitting structure 330 etch thus.

For an example, in order to fill a recessed portion of the roughness 920, a conductive material, for an example, at least one of material selected from Ti, Al, Al alloy, In, Ta, Pd, Co, Ni, Si, Ge, Ag, Ag alloy, Au, Hf, Pt, Ru and Au or an alloy thereof can be deposited on the exposed portion 918 of the first conduction type semiconductor layer 336, and subjected to patterning by photolithography or etching, to form the first electrode layer 350 having the gap 930 to the side 919 of the light emitting structure 330. In this instance, a portion the conductive material is filled in the recess portion of the roughness 920 becomes the roughness 375 of the first electrode layer 350 shown in FIG. 5.

Figure 23:
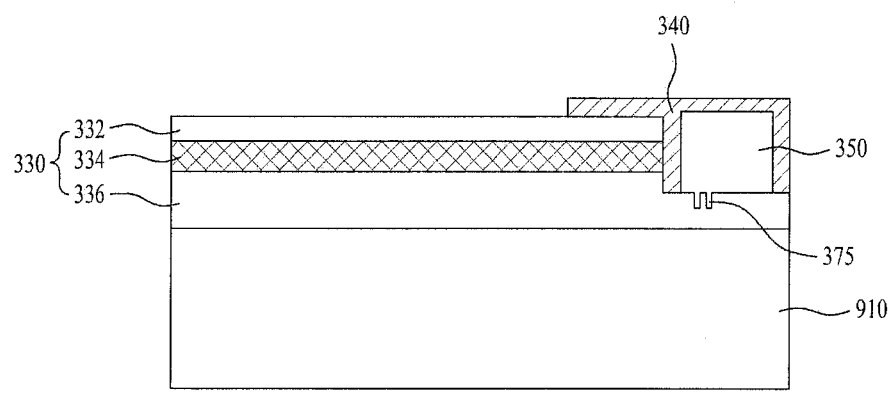

Next, referring to FIG. 23, an insulating layer 340 is formed to surround a circumference of the first electrode layer 350. For an example, the insulating layer 340 can be formed on sides and a top side of the first electrode layer 350, and the insulating layer 340 on the top side of the first electrode layer 350 can be extended up to a portion of an adjacent top side of the second conduction type semiconductor layer 332. And, the insulating layer 340 can fill the gap 930 between the side 919 of the light emitting structure 330 and the first electrode layer 350.

Figure 24:
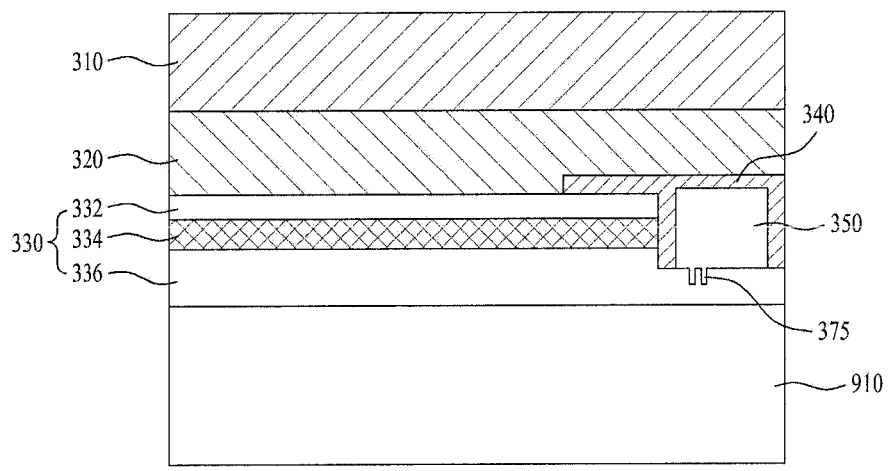

Next, referring to FIG. 24, a second electrode layer 320 is formed on the second conduction type semiconductor layer 332 and the insulating layer 340, and a support substrate 310 is formed on the second electrode layer 320. The second electrode layer 320 can include at least one of an ohmic layer, a reflective layer, and a bonding layer.

Next, referring to FIG. 25, the growth substrate 910 is removed from the light emitting structure 330 physically or/and chemically. FIG. 25 illustrates the structure in an upside down position.

Then, after removing the growth substrate 910, the light emitting structure 330 exposed thus is subjected to isolation etching. The isolation etching etches the light emitting structure which falls on boundary regions of unit chips. As the isolation etching etches the light emitting structure 330, a portion of a top side of the second electrode layer 320 is exposed. And, as the isolation etching etches a portion of the first conduction type semiconductor layer 336, though a top side of the first electrode layer 350 is exposed, the roughness 920 at the top side of the first electrode layer 350 is not exposed. That is, though the isolation etching makes a portion of the top side of the first electrode layer 350 having the roughness 920 formed thereon to be in contact with the first conduction type semiconductor layer 336, rest of the top side of the first electrode layer 350 can be opened from the first conduction type semiconductor layer 336. And, a roughness pattern (not shown) can be formed on the top side of the first conduction type semiconductor layer 336 for optical extraction efficiency.

Though not shown in FIG. 25, the conductive layer 360 shown in FIG. 6 can be formed on the first conduction type semiconductor layer 336, and a contact electrode 371 can be formed, which has one side in contact with the opened portion of the first electrode layer 350, and the other portion in direct or indirect contact with the first conduction type semiconductor layer 336 or/and the conductive layer 360.

Figure 26:
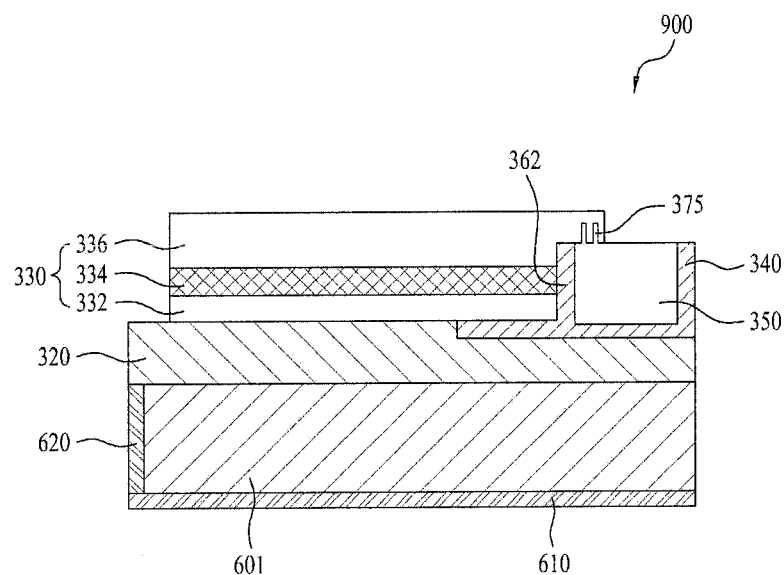
FIG. 26 illustrates a section of a light emitting device in accordance with another preferred embodiment of the present invention.

FIG. 26 illustrates a section of a light emitting device 900 in accordance with another preferred embodiment of the present invention. Parts identical to the parts in the embodiment shown in FIG. 5 will be given identical reference numerals, and description of duplicated portions thereof will be omitted.

Referring to FIG. 26, the light emitting device 900 includes an insulating substrate 601, a second electrode layer 320, a light emitting structure 330, an insulating layer 340, a first electrode layer 350, a bottom electrode 610, and a side electrode 620.

Referring to FIG. 26, the embodiment has the insulating substrate 601 as a support substrate, a side electrode 620 arranged at one side of the insulating substrate 601 connected to one side of the second electrode layer 320, and the bottom electrode 610 on an underside of the insulating substrate 601 connected to the side electrode 620. The second electrode layer 320 can be connected to the bottom electrode 610 through the side electrode 620. Though FIG. 26 illustrates the side electrode 620 arranged only one side of the second electrode layer 320, the arrangement is not limited to this, but the side electrode 620 can be arranged at both sides of the insulating substrate 601.

Figure 27:
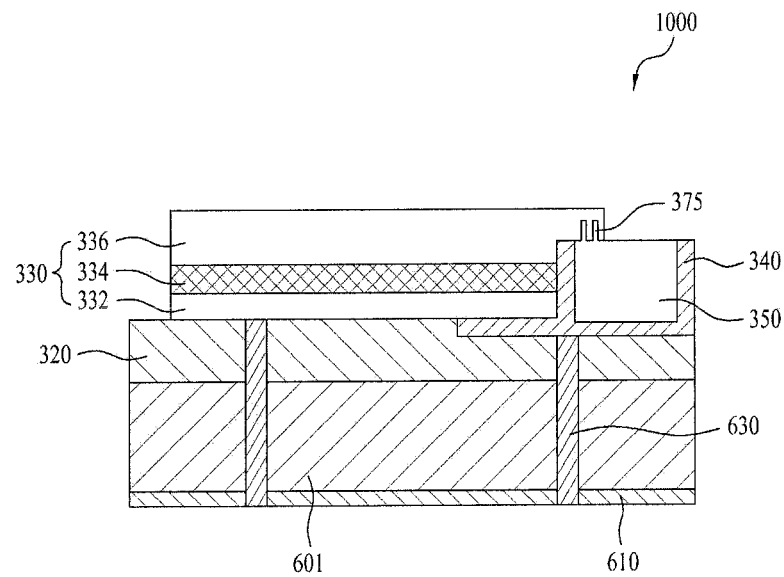
FIG. 27 illustrates a section of a light emitting device in accordance with another preferred embodiment of the present invention.

FIG. 27 illustrates a section of a light emitting device 1000 in accordance with another preferred embodiment of the present invention. Parts identical to the parts in the embodiment shown in FIG. 26 will be given identical reference numerals, and description of duplicated portions thereof will be emitted.

Referring to FIG. 27, the light emitting device 1000 includes an insulating substrate 601, a second electrode layer 320, a light emitting structure 330, an insulating layer 340, a first electrode layer 350, a bottom electrode 610, and a pass through electrode 630.

Referring to FIG. 27, the embodiment includes at least one pass through electrode 630 in a shape of via connected between the second electrode layer 320 and the bottom electrode 610 passed through the insulating substrate 601. In this instance, the pass through electrode 630 can have one end in contact with the bottom electrode 610, and the other end in contact with the second conduction type semiconductor layer 332 passed through the second electrode layer 320. And, in another embodiment, the pass through electrode 630 can have the other end only in contact with a bottom side of the second electrode layer 320 passed through the insulating substrate 601.

The light emitting device in any one of the foregoing embodiments has an increased adhesion between the first electrode layer 350 and the first conduction type semiconductor layer 336, thereby improving reliability.

Figure 28:
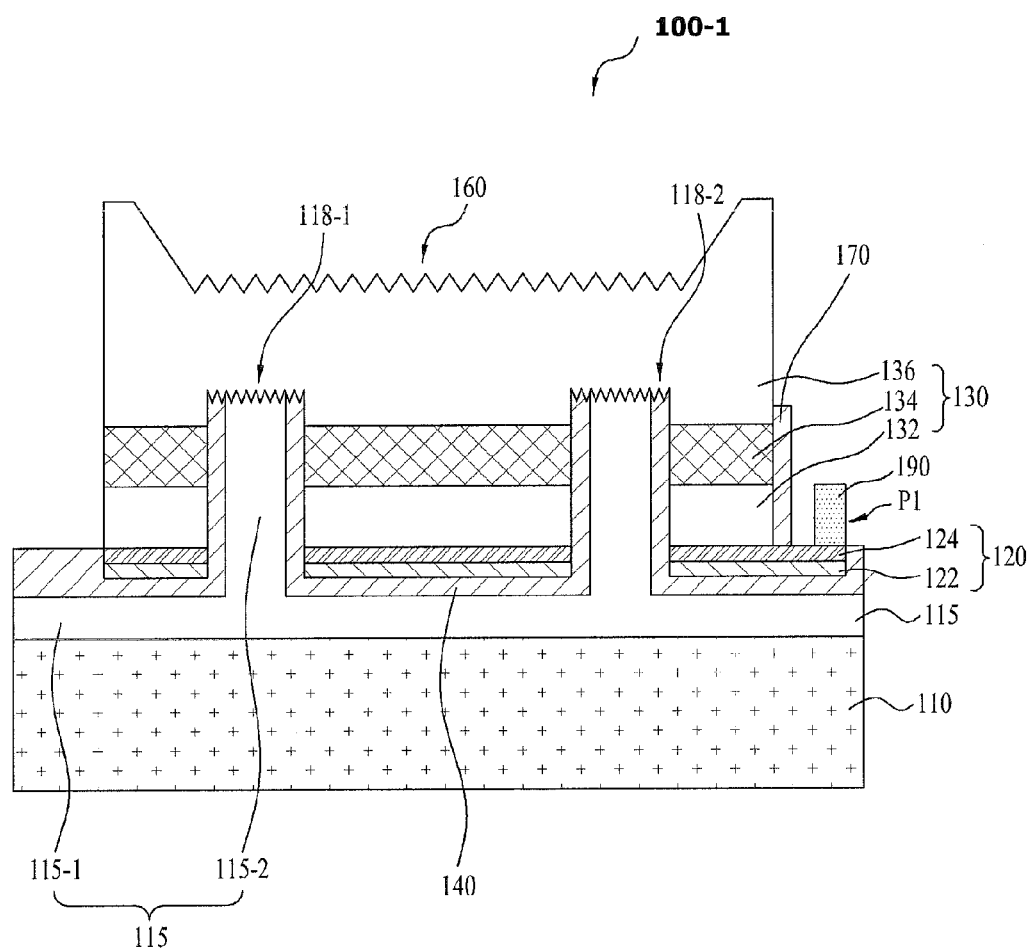
FIG. 28 illustrates a section of a light emitting device in accordance with another preferred embodiment of the present invention.

FIG. 28 illustrates a section of a light emitting device 100-1 in accordance with another preferred embodiment of the present invention. Parts identical to the parts in the embodiment shown in FIG. 1 will be given identical reference numerals, and description of duplicated portions thereof will be omitted.

Referring to FIG. 28, the light emitting device 100-1 includes a support substrate 110, a first electrode layer 115, a second electrode layer 120, a light emitting structure 130, an insulating layer 140, a protective layer 170, and a second electrode pad 190.

The top side of the contact portion 115-2 in contact with the first conduction type semiconductor layer 136 has a roughness, for an example, a first roughness 118-1. A portion 141 (See FIG. 1) of the insulating layer 140 surrounding the contact electrode 115-2 is in contact with the first conduction type semiconductor layer 136, and a portion of the insulating layer 140 in contact with the first conduction type semiconductor layer 136 has a second roughness 118-2. For an example, on a top side of a portion of the insulating layer 140 surrounding the side of the contact electrode 115-2 can have the second roughness 118-2. The first roughness 118-1 and the second roughness 118-2 can have a random irregular shape.

The first roughness 118-1 formed on the top side of the contact portion 115-2 and the second roughness 118-2 formed on the top side of a portion of the insulating layer 140 increases a contact area between the first conduction type semiconductor layer 136 and the insulating layer 140 to improve reliability of the light emitting structure 100-1.

Figure 29:
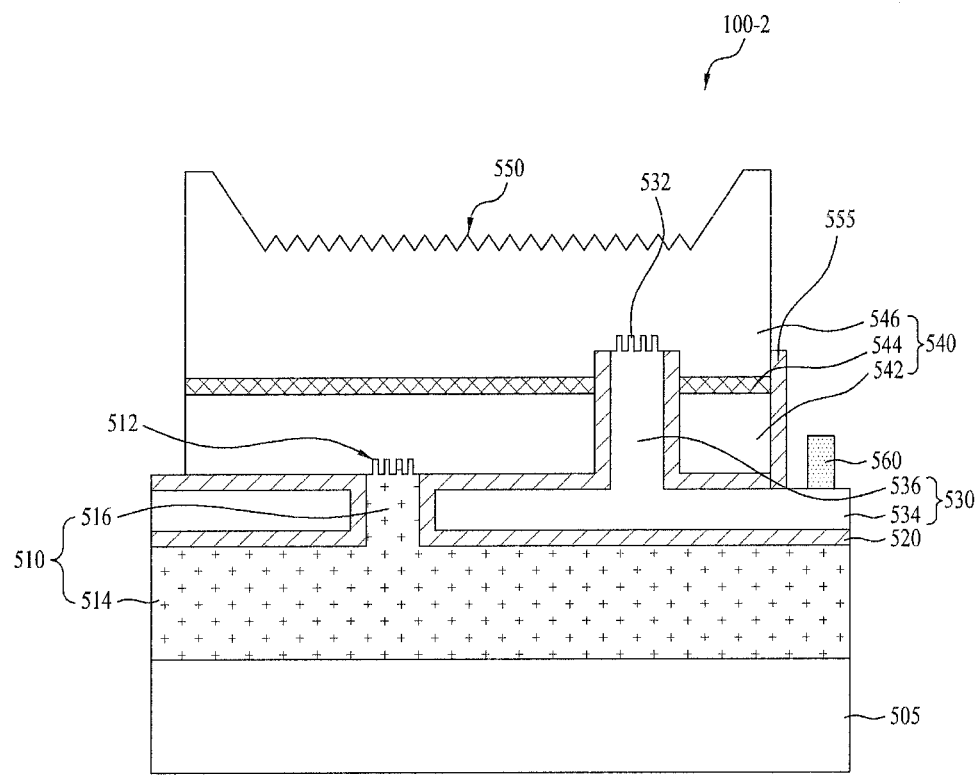
FIG. 29 illustrates a section of a light emitting device in accordance with another preferred embodiment of the present invention.

FIG. 29 illustrates a section of a light emitting device in accordance with another preferred embodiment of the present invention. The light emitting device 100-2 includes a support substrate 505, a second electrode layer 510, an insulating layer 520, a first electrode layer 530, a light emitting structure 540, a protective layer 555, and a first electrode pad 560.

The light emitting structure 540 includes a second conduction type semiconductor layer 542, an active layer 544, and a first conduction type semiconductor layer 546. The first electrode layer 530 is arranged under the light emitting structure 540. For an example, the first electrode layer 530 can be arranged under the second conduction type semiconductor layer 542. The light emitting structure 540 can be identical to the light emitting structure described with reference to FIG. 1.

The first electrode layer 530 is in contact with the first conduction type semiconductor layer 546 passed through the second conduction type semiconductor layer 542 and the active layer 544. The first electrode layer 530 has a roughness 532 at a portion in contact with the first conduction type semiconductor layer 546. In this instance, the roughness 532 can be identical to one described with reference to FIG. 1.

For an example, the first electrode layer 530 includes a first lower electrode layer 534 and at least one first contact electrode 536. The first lower electrode layer 534 can be arranged between the light emitting structure 540 and the second electrode layer 510. The at least one first contact electrode 536 is a branch from the first lower electrode layer 534 in contact with the first conduction type semiconductor layer 546 passed through the second conduction type semiconductor layer 542 and the active layer 544.

The second electrode layer 510 is arranged on the support substrate 505. The second electrode layer 510 is arranged on an underside the first electrode layer 530. The second electrode layer 510 is in contact with the second conduction type semiconductor layer 942 passed through the first electrode layer 930. The second electrode layer 510 can have a roughness 512 at a portion in contact with the second conduction type semiconductor layer 542.

For an example, the second electrode layer 510 can include a second lower electrode 514 arranged under the first electrode layer 530, and a second lower electrode layer 516 which is a branch from the second lower electrode 514 in contact with the second conduction type semiconductor layer 542 passed through the first electrode layer 530.

The second electrode layer 510 can include at least one of a bonding layer, a barrier layer, a reflective layer, and an ohmic layer.

The insulating layer 520 can be arranged between the first electrode layer 530 and the second electrode layer 510, between the second conduction type semiconductor layer 542 and the first electrode layer 530, and between the active layer 544 and the first electrode layer 530. The protective layer 555 is arranged at a side of the light emitting structure 540.

For an example, the insulating layer 520 can be arranged between the second lower electrode 514 and first lower electrode layer 534, between the first contact electrode 516 and the first lower electrode layer 534, between the second conduction type semiconductor layer 542 and the first lower electrode layer 534, between the second conduction type semiconductor layer 542 and the first contact electrode 536, and between the active layer 544 and the first contact electrode 536. And, the insulating layer 520 can be arranged between a side of the first contact electrode 536 and the first conduction type semiconductor layer 546.

The first electrode layer 530 has one side region exposed from the light emitting structure 540, and the first electrode pad 560 is arranged on one region of the first electrode layer 530 exposed from the light emitting structure 130.

Since the first contact electrode 536 has the roughness 532 at the top side, the first contact electrode 536 has an increased contact area to the first conduction type semiconductor layer 546. And, as the contact area between the first contact electrode 536 and the first conduction type semiconductor layer 546 increases, resistance of the first electrode layer 530 is reduced, to drop an operation voltage of the light emitting device 100-2, thereby enabling to improve optical output efficiency. And, as the contact area between the first contact electrode 536 and the first conduction type semiconductor layer 546 increases, adhesion between the first electrode layer 530 and the first conduction type semiconductor layer 546 increases, to improve reliability of the light emitting device 100-2.

Moreover, the roughness 512 at the top side of the second contact electrode 536 increases adhesion between the second electrode layer 510 and the second conduction type semiconductor layer 542, enabling to improve reliability of the light emitting device 100-2.

Figure 30:
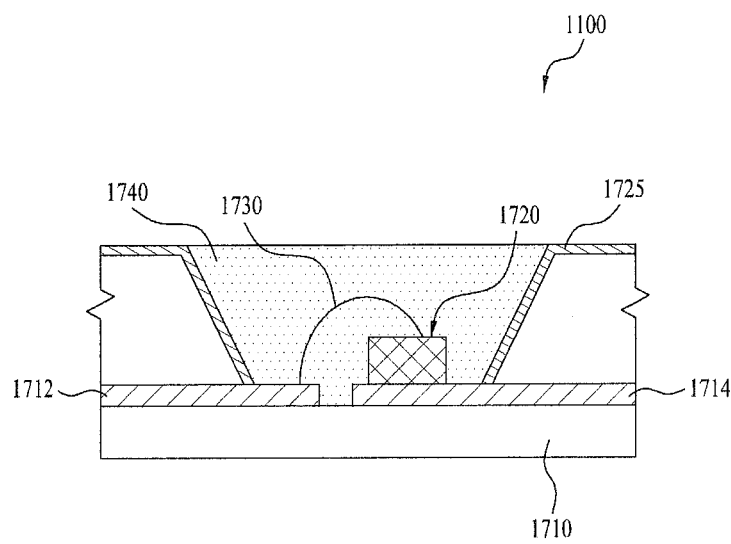
FIG. 30 illustrates a section of a light emitting device package in accordance with a preferred embodiment of the present invention.

FIG. 30 illustrates a section of a light emitting device package in accordance with a preferred embodiment of the present invention. Referring to FIG. 30, the light emitting device package 1100 includes a package body 1710, a first metal layer 1712, a second metal layer 1714, a light emitting device 1720, a reflective plate 1725, a wire 1730, and a resin layer 1740.

The package body 1710 has a cavity at one side region. In this instance, a side wall of the cavity can be sloped. The package body 1710 can be constructed of a substrate having good insulating property and thermal conductivity, such as a silicon based wafer level package, a silicon substrate, silicon carbide SiC, and aluminum nitride AlN, and have a structure in which a plurality of substrates are stacked. The embodiment does not limit a material, a structure and a shape of the body described above.

The first metal layer 1712 and the second metal layer 1714 are arranged on a surface of the package body 1710 so as to be separated electrically from the light emitting device 1720 taking heat dissipation and mounting of the light emitting device 1720 into account. The light emitting device 1720 is connected to the first metal layer 1712 and the second metal layer 1714, electrically. The light emitting device 1720 can be any one of the light emitting devices 100~1000, 100-1 described in foregoing embodiments.

For an example, the support substrate 110 of the light emitting device 100 in FIG. 1 can be connected to the second metal layer 1714 electrically, the second electrode pad 190 can be bonded to one side of the wire 1730, and the other side of the wire 1730 can be bonded to the first metal layer 1712.

And, for an example, the support substrate 110 of the light emitting device 200 in FIG. 2 can be arranged on the second metal layer 1714 or the package body 1710, and the first electrode pad 210 can be connected to the second metal layer 1714, electrically. For an example, the first electrode pad 210 can be wire bonded to the second metal layer 1714. The second electrode pad 190 can be bonded to one side of the wire 1730, and the other side of the wire 1730 can be bonded to the first metal layer 1712.

And, for an example, the support substrate 310 of the light emitting device 300 or 700 in FIG. 5 or 10 can be connected to the second metal layer 1714 electrically, and the first electrode 350 or 1710 can be bonded to one side of the wire 1730, and the other side of the wire 1730 can be bonded to the first metal layer 1712.

The reflective plate 1725 can be formed on the side wall of the cavity of the package body 1710 such that a light from the light emitting device is directed toward a predetermined direction. The reflective plate 1725 is formed of a light reflective material, for an example, can be a metal coating, or a metal foil.

The resin layer 1740 surrounds the light emitting device 1720 positioned in the cavity for protecting the light emitting device 1720 from an external environment. The resin layer 1740 can be formed of a colorless transparent polymer resin material, such as epoxy or silicone. The resin layer 1740 can contain a fluorescent material for changing a wave length of the light from the light emitting device 1720.

Since light emitting device package of the embodiment includes a light emitting device of which reliability is improved, reliability of the light emitting device package can be improved.

An array of the light emitting device packages can be on a substrate, and a light guide plate, a prism sheet, a diffusion sheet, and the like that are optical members can be arranged on a light path of the light emitting device package.

As another embodiment, a display device, an indicating device, or a lighting system can be produced, which includes the semiconductor light emitting device or the light emitting device package described in the foregoing embodiments, and the lighting system can include a lamp, a street light, and a car lighting device.

Figure 31:
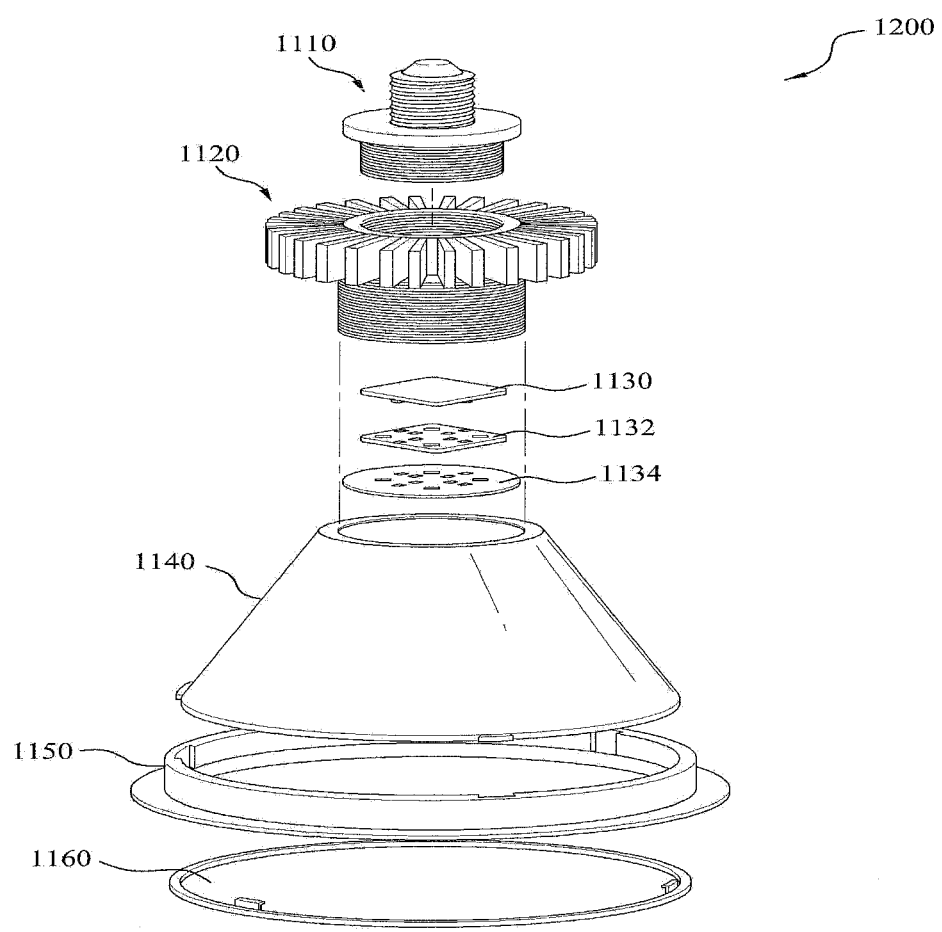
FIG. 31 illustrates an exploded perspective view of a lighting device having a light emitting device in accordance with another preferred embodiment of the present invention applied thereto.

FIG. 31 illustrates an exploded perspective view of a lighting device 1200 having a light emitting device in accordance with another preferred embodiment of the present invention applied thereto. Referring to FIG. 31, the lighting device 1200 includes a power source coupler 1110, a heat sink 1120, a light emitting module 1130, a reflector 1140, a cover cap 1150, and a lens unit 1160.

The power source coupler 1110 has a top side with a screw for placing in an external power source socket (not shown) to supply power to the light emitting module 1130. The heat sink 1120 dissipates heat from the light emitting module 1130 through heat dissipating fins at a side thereof. The heat sink 1120 has a top side screw coupled to a bottom side of the power source coupler 1110.

The heat sink 1120 has a bottom side having the light emitting module 1130 which includes the light emitting device packages mounted to a circuit board secured thereto. In this instance, the light emitting device packages can be the light emitting device package in accordance with the embodiment shown in FIG. 30.

The lighting device 1200 can include an insulating sheet 1132 and a reflective sheet 1134 under the light emitting module 1130 for electric protection of the light emitting module, additionally. Moreover, optical members which can perform various optical functions can be arranged on a light travel path of the light from the light emitting module 1130.

The reflector 1140 of a circular truncated cone shape is coupled to an underside of the heat sink 1120 for reflecting the light from the light emitting module 1130. The cover cap 1150 of a circular ring shape is coupled to an underside of the reflector 1140. The lens unit 1160 is placed in the cover cap 1150. The lighting device 1200 in FIG. 31 can be used as a downlight buried in a ceiling or wall of a building. Since the lighting device includes the light emitting device package of which reliability is improved, reliability of the lighting device can be improved.

Figure 32A:
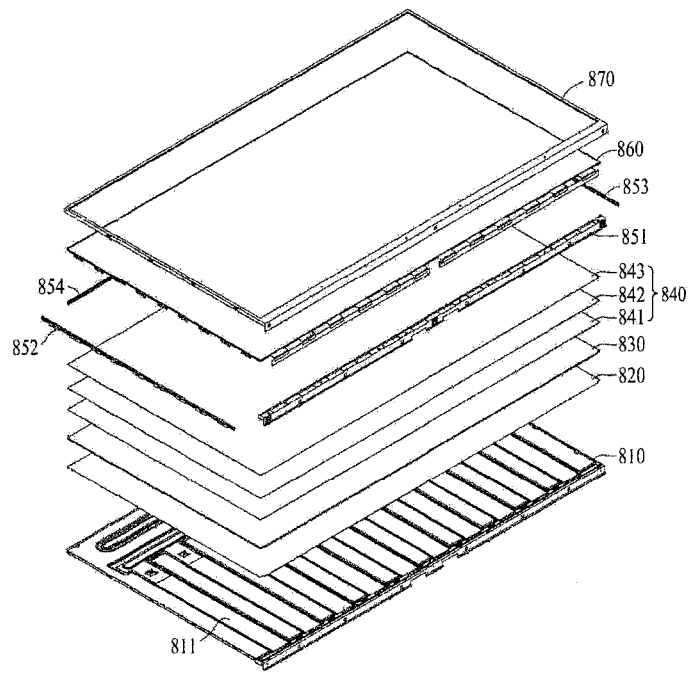
FIG. 32A illustrates an exploded perspective view of a display device having a light emitting device package in accordance with a preferred embodiment of the present invention applied thereto.
Figure 32B:
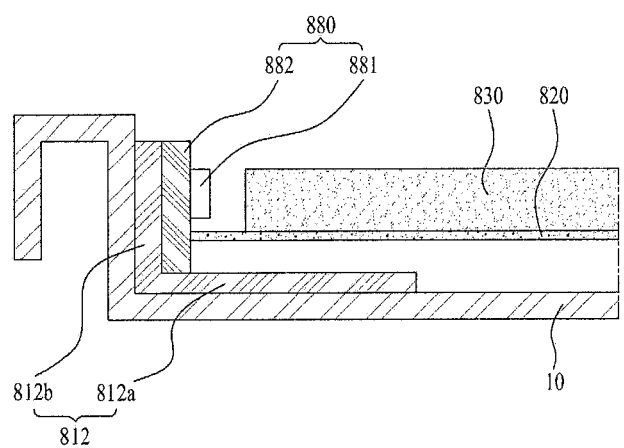
FIG. 32B illustrates a section of a light source portion of the display device in FIG. 32A.

FIG. 32A illustrates an exploded perspective view of a display unit having a light emitting device package in accordance with a preferred embodiment of the present invention applied thereto, and FIG. 32B illustrates a section of a light source portion of the display unit in FIG. 32A.

Referring to FIGS. 32A and 32B, the display unit includes a backlight unit and a liquid crystal display panel 860, a top cover 870, and a fastening member 850.

The backlight unit includes a bottom cover 810, a light emitting module 880 on one side of inside of the bottom cover 810, a reflective plate 820 arranged on a front of the bottom cover 810, a light guide plate 830 arranged on a front of the reflective plate 820 for guiding the light from the light emitting module 880 toward a front of the display device, and an optical member 840 arranged on a front of the light guide plate 830. The liquid crystal display panel 860 is arranged on a front of the optical member 840, the top cover 870 is provided to a front of the liquid crystal display panel 860, the fastening member 850 is arranged between the bottom cover 810 and the top cover 870 and fastened together with the bottom cover 810 and the top cover 870.

The light guide plate 830 serves to guide the light from the light emitting module 880 to be emitted as a surface light source, the reflective plate 820 on a rear of the light guide plate 830 causes the light from the light emitting module 880 to be reflected toward the light guide plate 830 for improving light efficiency. However, the reflective plate 820 can be provided as a separate element as shown in the drawing, or provided as a coat of a high reflectivity material applied to the rear of the light guide plate 830 or to the front of the bottom cover 810. In this instance, the reflective plate 820 can be formed of a material which has high reflectivity and can be very thin, such as PolyEthylene Terephtalate PET.

And, the light guide plate 830 scatters the light from the light emitting module 880 for uniform distribution of the light to an entire region of a screen of the liquid crystal display panel 860. Accordingly, the light guide plate 830 is formed of a material having good refractivity and transmissivity, such as PolyMethylMethAcrylate PMMA, PolyCarbonate PC, or PolyEthylene PE.

And, the optical member 840 on the light guide plate 830 causes the light from the light guide plate 830 to diverge at a predetermined angle. The optical member 840 causes the light lead by the light guide plate 830 to travel toward the liquid crystal display panel 860, uniformly.

The optical member 840 can be a selective stack of optical sheets, such as a diffusion sheet, a prism sheet, or a protective sheet or a micro-lens array. In this instance, a plurality of the optical sheets can be used, and can be formed of acryl resin, polyurethane resin, or transparent resin, such as silicone resin. And, the prism sheet can contain a fluorescent sheet.

The liquid crystal display panel 860 can be provided to the front of the optical member 840. In this instance, it is apparent that, instead of the liquid crystal display panel 860, other kinds of display device which requires the light source can be provided to the front of the optical member 840.

The reflective plate 820 is placed on the bottom cover 810, and the light guide plate 830 is placed on the reflective plate 820. According to this, the reflective plate 820 can be in contact with the heat dissipating member (not shown) directly. The light emitting module 880 includes a light emitting device package 882 and a printed circuit board 881. The light emitting device package 882 is mounted on the printed circuit board 881. The light emitting device package 881 can be the embodiment illustrated in FIG. 30.

The printed circuit board 881 can be bonded to a bracket 812. The bracket 812 can be formed of a material having high heat conductivity for heat dissipation in addition to fastening of the light emitting device package 882, and though not shown, a heat pad can be provided between the bracket 812 and the light emitting device package 882 for easy heat transfer. And, as shown, the bracket 812 has a L shape such that a transverse portion 812a is supported on the bottom cover 810 and the longitudinal portion 812b is fastened to the printed circuit board 881. Since the display unit of the embodiment includes the light emitting device package of which reliability is improved, reliability of the display unit can be improved.

As has been described, the light emitting device of the present invention can improve an operation voltage and reliability.

Features, structures, effects, and so on described in above embodiments are included to at least one of embodiments, but not limited to only one embodiment invariably. Furthermore, it is apparent that the features, the structures, the effects, and so on described in the embodiments can be combined, or modified with other embodiments by persons skilled in this field of art. Therefore, it is required to understand that such combination and modification is included to scope of the present invention.

What is claimed is:

1. A light emitting device comprising:
a light emitting structure including a second conduction type semiconductor layer, an active layer, and a first conduction type semiconductor layer;
a second electrode layer arranged under the light emitting structure;
at least one first recess provided to pass through the second electrode layer, the second conduction type semiconductor layer and the active layer and exposing the first conduction type semiconductor layer, wherein a plurality of second recesses are provided at a distal end of the at least one first recess;
a first electrode layer provided in the at least one first recess and the plurality of second recesses at the distal end of the at least one first recess and directly contacting an exposed region of the first conduction type semiconductor layer through the first recess; and
an insulating layer disposed adjacent a side surface of the at least one first recess, and arranged between the second electrode layer and the first electrode layer, between the second conduction type semiconductor layer and the first electrode layer, and between the active layer and the first electrode layer, wherein the insulating layer contacts exposed regions of the first conduction type semiconductor layer,
wherein the first electrode layer has a roughness provided in the plurality of second recesses, and the roughness provided in the plurality of second recesses increases a contact area with the first conduction type semiconductor layer and is in ohmic contact with the first conduction type semiconductor layer.

2. The light emitting device as claimed in claim 1, further comprising a support substrate under the first electrode layer, wherein the first electrode layer includes at least one contact electrode in contact with the first conduction type semiconductor layer passing through the second electrode layer, the second conduction type semiconductor layer, and the active layer, and the at least one contact electrode has a top side with the roughness.

3. The light emitting device as claimed in claim 2, wherein the first electrode layer includes;
a lower electrode layer arranged between the support substrate and the second electrode layer, and
the at least one contact electrode which is a branch from the lower electrode layer in contact with the first conduction type semiconductor layer.

4. The light emitting device as claimed in claim 3, wherein the contact electrode has a width of 5 μm~200 μm.

5. The light emitting device as claimed in claim 3, wherein a height from a top side of the active layer to a top side of the contact electrode is 0.4 μm~10 μm.

6. The light emitting device as claimed in claim 2, wherein the roughness has a width of 0.02 μm~100 μm, and a height of 0.2 μm~10 μm.

7. The light emitting device as claimed in claim 3, wherein the insulating layer is arranged between the lower electrode layer and the second electrode layer, between a side of the contact electrode and the second electrode layer, between the side of the contact electrode and the second conduction type semiconductor layer, and between the side of the contact electrode and the active layer.

8. The light emitting device as claimed in claim 2, wherein the roughness has a vertical cross-section presenting a stepwise structure or a tiered structure.

9. The light emitting device as claimed in claim 1, wherein the first electrode layer is arranged on the second electrode layer, and includes;
a contact portion in contact with the first conduction type semiconductor layer overlapped with the light emitting structure in a vertical direction, and
an exposed portion not overlapped with the light emitting structure in the vertical direction and exposed from the light emitting structure,
wherein the vertical direction is a direction facing from the second electrode layer toward the first conduction type semiconductor layer, and a top side of the contact portion has the roughness.

10. The light emitting device as claimed in claim 9, wherein the first electrode layer has at least one further portion overlapped by the light emitting structure having a top side with a roughness in contact with the first conduction type semiconductor layer.

11. The light emitting device as claimed in claim 1, wherein the first electrode layer includes;
a contact portion in contact with the first conduction type semiconductor layer, and
an exposed portion opened from the first conduction type semiconductor layer, wherein the contact portion has a roughness.

12. The light emitting device as claimed in claim 1, wherein the light emitting structure is divided into a plurality of cell regions spaced from one another on the second electrode layer by predetermined distances, and the first electrode layer includes;

a contact portion in contact with the first conduction type semiconductor layer passing through the second conduction type semiconductor layer and the active layer of each of the plurality of cell regions, and an exposed portion exposed from the first conduction type semiconductor layer, wherein the contact portion has a roughness.

13. The light emitting device as claimed in claim 3, wherein the first electrode layer includes at least one of an ohmic layer, a reflective layer, and a bonding layer.

14. The light emitting device as claimed in claim 2, wherein the at least one contact electrode has a top side higher than a top side of the active layer, and lower than a top side of the first conduction type semiconductor layer.

15. The light emitting device as claimed in claim 2, wherein the second electrode layer has one side region opened from the light emitting structure, and further includes a second electrode pad arranged on the one opened side region.

16. The light emitting device as claimed in claim 2, wherein the first electrode layer has one side opened from the light emitting structure, and further includes a first electrode pad arranged on the one opened side of the first electrode layer.

17. The light emitting device as claimed in claim 3, wherein the insulating layer surrounds the at least one contact electrode, wherein a portion of the insulating layer which surrounds the side of the at least one contact electrode has a roughness in contact with the first conduction type semiconductor layer.

18. The light emitting device as claimed in claim 17, wherein the roughness has a random irregular shape.

19. The light emitting device as claimed in claim 1, further comprising a protective layer arranged at a sidewall of the light emitting structure.

20. The light emitting device as claims in claim 2, wherein a portion of the insulating layer is arranged to surround a side of the at least one contact electrode except the top side of the at least one contact electrode for blocking electric shorts with the second electrode layer, the second conduction type semiconductor layer, and the active layer.

\* \* \* \* \*